(12) United States Patent
Inaba

(10) Patent No.: US 7,400,016 B2
(45) Date of Patent: Jul. 15, 2008

(54) SEMICONDUCTOR DEVICE REALIZING CHARACTERISTICS LIKE A SOI MOSFET

(75) Inventor: Satoshi Inaba, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 68 days.

(21) Appl. No.: 11/143,715

(22) Filed: Jun. 3, 2005

(65) Prior Publication Data

US 2005/0218449 A1    Oct. 6, 2005

Related U.S. Application Data

(62) Division of application No. 10/042,264, filed on Jan. 11, 2002, now Pat. No. 6,930,361.

(30) Foreign Application Priority Data

Jan. 18, 2001   (JP)   ............... 2001-10449

(51) Int. Cl.
*H01L 29/10*   (2006.01)
(52) U.S. Cl. .............. 257/337; 257/E29.267; 257/E29.063
(58) Field of Classification Search ......... 257/335–337, 257/344, 345, 408, E29.267, E29.063
See application file for complete search history.

(56) References Cited

U.S. PATENT DOCUMENTS

| | | | |
|---|---|---|---|
| 4,819,043 A | | 4/1989 | Yazawa et al. |
| 5,463,237 A | * | 10/1995 | Funaki ..................... 257/336 |
| 5,580,799 A | | 12/1996 | Funaki |
| 5,583,361 A | | 12/1996 | Morishita |
| 5,675,172 A | * | 10/1997 | Miyamoto et al. .......... 257/402 |
| 5,698,884 A | | 12/1997 | Dennen |
| 6,162,694 A | * | 12/2000 | Cheek et al. ................ 438/305 |

(Continued)

FOREIGN PATENT DOCUMENTS

EP    0 962 988 A2    12/1999

(Continued)

OTHER PUBLICATIONS

M. Miyamoto, R. Nagi and T. Nagano, "Pseudo-SOI: P-N-P Channel-Doped Bulk MOSFET for Low-Voltage High Performance Applications", IEDM 1998, pp. 411-414.

(Continued)

*Primary Examiner*—Thomas L Dickey
(74) *Attorney, Agent, or Firm*—Pillsbury Winthrop Shaw Pittman, LLP

(57) ABSTRACT

In a semiconductor device, source/drain layers have a low resistivity region and an extension region extending from the low resistivity region toward the channel region. The extension regions are lower in impurity concentration and shallower in depth than the low resistivity regions. The device also has a first impurity-doped layer formed in the channel region between the source/drain layers, a second impurity-doped layer formed under the first impurity-doped layer, and a third impurity-doped layer formed under the second impurity-doped layer. The first impurity-doped layer is equal or less in junction depth than the extension regions. The second impurity doped layer has impurity concentration and thickness to be fully depleted due to a built-in potential as created between the first and third impurity-doped layers.

9 Claims, 16 Drawing Sheets

U.S. PATENT DOCUMENTS 6,163,053 A    12/2000    Kawashima

FOREIGN PATENT DOCUMENTS

| JP | 60-50960 |   | 3/1985 |
| --- | --- | --- | --- |
| JP | 63-036571 | A | 2/1988 |
| JP | 04-287375 | A | 10/1992 |
| JP | 04-287376 | A | 10/1992 |
| JP | 06-045598 | A | 2/1994 |
| JP | 07-131002 | A | 5/1995 |
| JP | 07-147399 | A | 6/1995 |
| JP | 07-312423 |   | 11/1995 |
| JP | 7-335837 |   | 12/1995 |
| JP | 10-116983 | A | 5/1998 |
| KR | 1999-0082088 |   | 11/1999 |
| WO | WO 97/29519 |   | 8/1997 |

OTHER PUBLICATIONS

T. Mizuno, Y. Asao, J. Koga, "High Performance Shallow Junction Well Transistor (SJET)", ULSI Research Center, pp. 109-110.

Miyamoto et al., "Pseudo-SOI: P-N-P-Channel-Doped Bulk MOSFET for Low Voltage High Performance Applications," Electron Devices Meeting, 1998, pp. 15.3.1-15.3.4.

Mizuno, Tomohisa, "Analytical Model for High-Performance Shallow-Junction-Well Transistor (SJET) with a Fully Depleted Channel Structure," IEEE Transaction on Electron Devices, vol. 40, No. 1, Jan. 1993, pp. 105-111, XP 002240660.

Sze, S. M., "A Wiley-Interscience publication," ISBN 0-471-05661-8, 1981.

Office Action dated Apr. 25, 2006.

Japanese Office Action dated Nov. 21, 2006.

Japanese Decision of Final Rejection dated May 1, 2007.

Report for Pretrial Examination dated Aug. 31, 2007.

\* cited by examiner

DEPTH FROM CHANNEL SURFACE [nm]

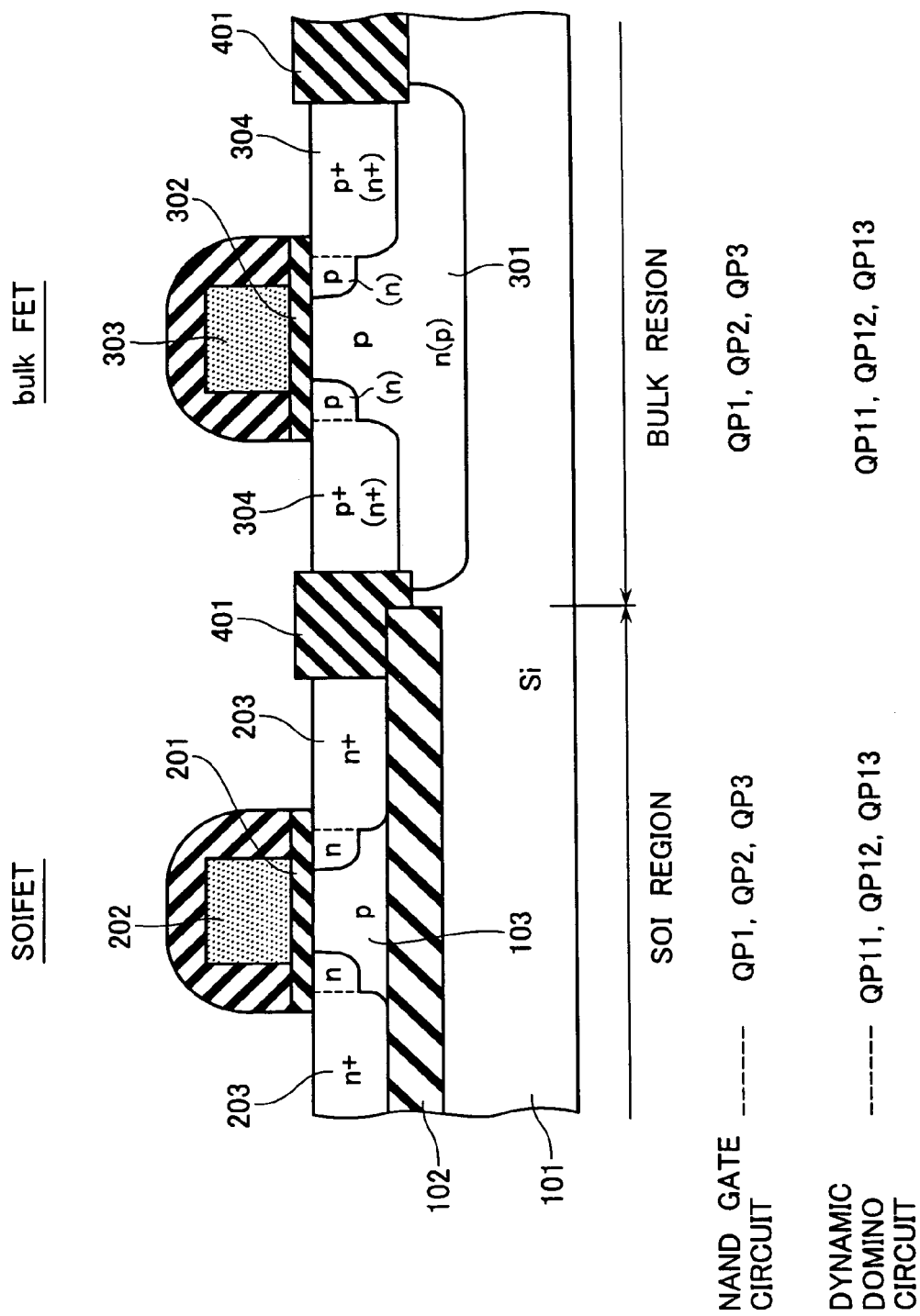

SEMICONDUCTOR DEVICE REALIZING CHARACTERISTICS LIKE A SOI MOSFET

CROSS REFERENCE TO RELATED APPLICATIONS

This is a Divisional of U.S. Ser. No. 10/042,264, filed Jan. 11, 2002 now U.S. Pat. No. 6,930,361, which in turn claims priority to Japanese Patent Application No. 2001-10449, filed Jan. 18, 2001, both of which are incorporated herein by reference in their entireties.

BACKGROUND OF THE INVENTION

1. Field of the Invention

This invention relates generally to semiconductor devices using bulk semiconductor for achievement of highly miniaturized transistors with enhanced performance. The invention also relates to a method of fabricating the same.

2. Description of Related Art

Today, metal insulator semiconductor field effect transistors (MISFETs) using silicon-on-insulator (SOI) substrates with a fully depleted channel region are under diligent research and development at some leading companies and laboratories, for use as transistors suitable for microfabrication and performance enhancement schemes. The MOSFETs of this type will be referred to as fully depleted SOIFETs or simply FD-SOIFETS. Typically these FD-SOIFETs are designed to have a specific thickness and impurity concentration low enough to permit a silicon layer overlying an oxide film for use as a channel region to be fully depleted.

In such FD-SOIFETs, a vertical electric field from a gate electrode is partly allotted by a buried oxide film at the bottom of a channel region, resulting in a likewise decrease in vertical electric field being applied to the channel region. As a result of such decrease or "relaxation" of this channel region's vertical electric field, the channel region increases in carrier mobility, leading to an advantage or merit as to the obtainability of higher current driving ability or "drivability."

Unfortunately in view of the quest for higher integration and miniaturization, the advantage of FD-SOIFETs does not come without accompanying several penalties. Examples of the penalties are as follows. First, in order to suppress the so-called "short channel" effect, it becomes inevitable to employ SOI substrates with ultra-thin silicon layers. Second, the use of such ultrathin silicon layers would result in an unwanted increase in parasitic resistance values. Third, as a channel region surrounded by oxide films which are ordinarily less in thermal conductivity than silicon, the conductivity of heat generated in self-heatup regions near a drain is made inferior, resulting in an increase in degradation of performance. Another penalty is a problem that the SOI substrates are relatively less in quality whereas gate dielectric films stay less in reliability, causing possible plasma damages to increase accordingly. A further penalty lies in high price of the SOI substrates at least at the present time.

In contrast, attempts are made to avoid the above-noted problems or demerits of FD-SOIFETs by employment of bulk semiconductors while letting them offer similar effects to the FD-SOIFETs. An example of this approach proposed today is to realize a pseudo-SOIFET by use of a "p/n⁻/p" multilayer structure including a p-type channel region and its underlying lightly-doped n (n⁻) type layer depleted due to a built-in potential. Examples of the p/n⁻/p structure are found in several documents—for example, 1) T. Mizuno et al., 1991 Symp. on VLSI Tech. at page 109 (1991), 2) M. Miyamoto et al., IEDM Tech. Digest, p. 411 (1998), and 3) Ishii and Miyamoto, Published Unexamined Japanese Patent Application No. 7-335837.

The proposed pseudo-SOIFET structures are still encountered with many problems to be solved, one of which is the difficulty in obtaining any sufficient performance on the order of submicrons of minimum feature size. More specifically, the pseudo-SOIFETs as taught from the above-identified three documents ("D1-D3") are arranged so that a channel region is greater in depth (thickness) than its associated source and drain diffusion layers. This is a serious bar to suppression of short-channel effects in the case of further miniaturization or shrinkage. Additionally if a semiconductor layer of such channel region is formed of an impurity-doped layer low in impurity concentration enough to realize a fully depleted element, then punch-through can disadvantageously take place in cases where the gate length (channel length) is shortened to be on the order of submicrons. And, in order to prevent this punch-through, complicated drain structures should be required, such as the ones as disclosed in the documents D2-D3.

It is also noted that with the structures as taught by D2-D3, the bottom portions of source/drain diffusion layers to be fabricated by counter-doping techniques are made deep enough to reach the p-type layer beneath the n⁻-type layer. This would result in an undesired increase in junction capacitance of the source/drain, thereby making difficult achievement of high-speed operabilities.

Further note that the documents D2-3 merely suggest the use of ion doping or implantation methods as the method of obtaining the p/n⁻/p structure of the channel region. Simple use of such ion implantation methods for obtaining the p/n⁻/p channel structure can reach a limit in further reduction of channel region impurity concentration and thickness.

SUMMARY OF THE INVENTION

In accordance with one aspect of this invention, a semiconductor device includes a semiconductor substrate; a gate electrode formed over a surface of the semiconductor substrate with a gate dielectric film interposed therebetween; a pair of source and drain diffusion layers formed in the semiconductor substrate to oppose each other with a channel region residing therebetween at a location immediately beneath the gate electrode, the source and drain diffusion layers each having a low resistivity region and an extension region being formed to extend from this low resistivity region toward the channel region and being lower in impurity concentration and shallower in depth than the low resistivity region; a first impurity doped layer of a first conductivity type formed in the channel region between the source/drain diffusion layers; a second impurity doped layer of a second conductivity type formed under the first impurity doped layer; and a third impurity doped layer of the first conductivity type formed under the second impurity doped layer, wherein the first impurity doped layer is equal to or less in junction depth than the extension region of each of the source/drain diffusion layers, and wherein the second impurity doped layer is determined in impurity concentration and thickness to ensure that this layer is fully depleted due to a built-in potential creatable between the first and third impurity doped layers.

In accordance with another aspect of this invention, a semiconductor device includes a semiconductor substrate; a gate electrode as formed above a surface of the semiconductor substrate with a gate dielectric film sandwiched therebetween; a pair of source and drain diffusion layers formed in the semiconductor substrate to oppose each other with a channel region laterally interposed therebetween at a location immediately beneath the gate electrode; a first impurity doped layer of a first conductivity type formed in the channel region between the source/drain diffusion layers; a second impurity doped layer of a second conductivity type formed under the first impurity doped layer; and a third impurity doped layer of the first conductivity type formed under the second impurity doped layer, wherein the first impurity doped layer is equal to or less in junction depth than the source and drain diffusion layers, and wherein the second impurity doped layer is determined in impurity concentration and thickness causing a depth of its junction with the third impurity doped layer to be greater than a junction depth of the source/drain diffusion layers while permitting the second impurity doped layer to be fully depleted due to a built-in potential creatable between the first and third impurity doped layers.

In accordance with a further aspect of this invention, a method of fabricating a semiconductor device includes: letting a first semiconductor layer with no impurity doped therein epitaxially grow on a semiconductor substrate having in at least its surface a first impurity doped layer of a first conductivity type; performing ion implantation into the first semiconductor layer to form a second impurity doped layer of a second conductivity type as contacted with the first impurity doped layer; doing ion implantation into a surface portion of the first semiconductor layer to form a third impurity doped layer of the first conductivity type in contact with the second impurity doped layer; forming above the third impurity doped layer a gate electrode with a gate dielectric film sandwiched therebetween; and forming in the semiconductor substrate a pair of source and drain diffusion layers being self-aligned with the gate electrode and having a junction depth deeper than a junction between the third impurity doped layer and the second impurity doped layer and yet shallower than a junction between the second impurity doped layer and the first impurity doped layer.

BRIEF DESCRIPTION OF THE DRAWINGS

FIG. 25 depicts a sectional view of a device structure with an SOIFET and a bulk FET integrated together.

DETAILED DESCRIPTION OF THE EMBODIMENTS

Several embodiments of this invention will now be set forth in detail with reference to the accompanying drawings below. Note that although the embodiments below are all drawn to n-channel metal insulator semiconductor field effect transistors (MISFETs), this invention may also be applicable without any material alternations to p-channel MISFETs with respective portions being replaced by those of opposite conductivity types.

First Embodiment

Figure 1:
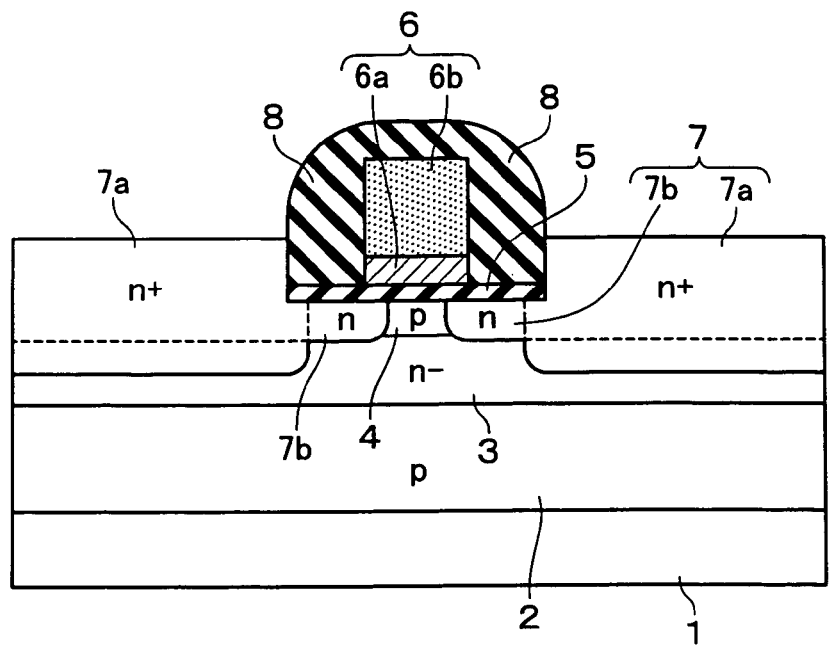
FIG. 1 is a diagram illustrating, in cross-section, main part of an FD-SOIFET structure in accordance with an embodiment of this invention.

Referring to FIG. 1, there is illustrated a sectional view of a structure of main part of a MISFET in accordance with a first embodiment of the invention.

A silicon substrate 1 has its top surface in which a p-type impurity doped layer 2 is formed by well ion implantation techniques. Formed on this p-type layer 2 are a lightly-doped n (n$^-$) type impurity doped layer of low impurity concentration and further a p-type impurity doped layer 4 for use as a channel region. These layers 2-4 make up a multilayer lamination structure with p/n⁻/p junction. Certain portions of this p/n⁻/p junction multilayer structure—at least the upper p-type layer 4 and its underlying n⁻-type layer 3—are fabricated by epitaxial growth process and ion implantation process in combination, as will be described in detail later in the description.

As shown in FIG. 1, a gate electrode 6 is formed over the p-type layer 4 for use as the channel region, with a gate dielectric film 5 being interposed therebetween. The gate electrode 6 consists essentially of a metal electrode 6a having a prespecified work function and a polycrystalline silicon or "polysilicon" electrode 6b stacked on metal electrode 6a.

The illustrative MISFET structure also includes source and drain diffusion layers 7. These source/drain diffusion layers 7 are each structured from a heavily-doped n (n⁺) type region 7a of low electrical resistivity and a shallow n-type extension region 7b that is lower in impurity concentration than n⁺-type region 7a. The low-resistivity n⁺-type layer 7a is fabricated through ion implantation with both the gate electrode 6 and a sidewall dielectric film 8 as provided on a lateral wall of gate electrode 6 being used as a mask therefor. The shallow n-type extension region 7b is formed by ion implantation with gate electrode 6 as a mask, prior to fabrication of sidewall dielectric film 8, in such a manner as to extend from n⁺-type low-resistivity region 7a toward the channel region. Low resistivity region 7a is formed in the state that it is upwardly projected than the level of gate dielectric film 5. As will be set forth later, this structure is obtainable by effectuation of selective epitaxial growth after having formed gate electrode 6. And the use of this structure permits a junction plane or surface at the bottom of low resistivity region 7a is located at a position that does not reach the underlying p-type layer 2—that is, within n-type layer 3.

The n⁻-type layer 3 of the p/n⁻/p junction multilayer structure beneath the gate electrode 6 is carefully designed to have a specific impurity concentration and thickness, causing layer 3 to be completely or fully depleted due to a built-in potential between the upper and lower p-type layers 4, 2. With such impurity concentration/thickness settings, the transistor of this embodiment becomes a "pseudo" silicon-on-insulator (SOI) FET that is similar to an SOI structure with a buried oxide film under a channel region. This unique type of transistor may be considered to be the one that employs silicon overlying a depletion layer. In this respect, the transistor will be referred to hereinafter as "silicon on depletion layer" FET or simply "SODEL" FET.

The p-type channel region layer 4 is carefully adjusted both in its impurity concentration and in thickness to ensure that layer 4 is fully depleted upon formation of a channel inversion layer. With such an arrangement, the illustrative structure becomes a fully depleted (FD) element—that is, FD-SODELFET. In particular the p-type layer 4 should be required to be sufficiently thin in order to suppress or minimize the so-called short channel effects. To this end, its junction depth (the position of a junction plane with n⁻-type layer 3) is set less than or equal to that of the source/drain extension regions 7b. The example of FIG. 1 is illustratively such that p-type layer 4 is less or "shallower" in junction depth than source/drain extension regions 7b.

Figure 3:
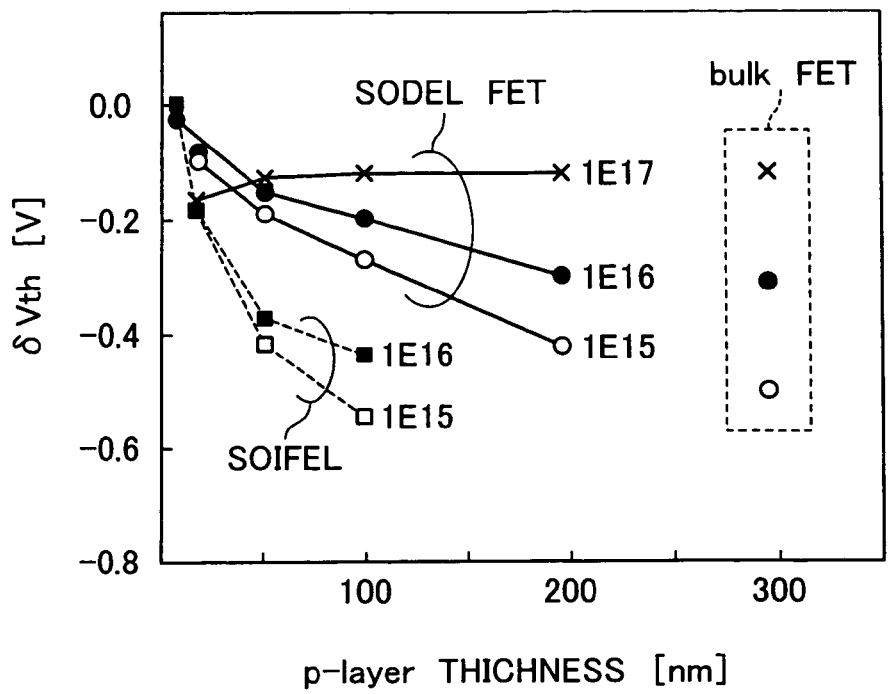
FIG. 3 is a graph showing a relation of a threshold voltage roll-off value δVth versus p-type layer thickness of an SODELFET embodying the invention in comparison with that of an SOIFET.
Figure 13:
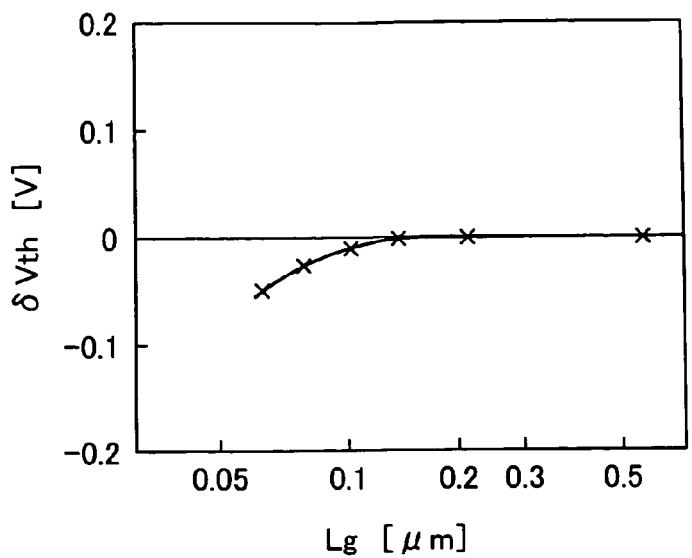
FIG. 13 is a graph showing a plot of threshold voltage roll-off value as a function of gate length.

See FIG. 3. This graph shows a relation of threshold voltage's roll-off value δVth (a difference between a threshold voltage upon occurrence of short-channeling and a threshold voltage during long-channeling) versus thickness of the p-type layer 41n the channel region, with the impurity concentration of p-type layer 4 as a parameter. Additionally it is known among those skilled in the semiconductor device art that the threshold voltage roll-off value δVth increases with a decrease in gate length Lg (i.e. channel length) as shown in FIG. 13. The data of FIG. 3 was obtained through computation while letting n⁻-type layer 3 measure 1E16/cm³ in impurity concentration and a gate oxide film thickness be set at 3 nanometers (nm) under application of a supply voltage Vdd of 1.2 volts (V). For comparison purposes, the graph of FIG. 3 shows data of an SOIFET by dotted lines; in addition, data plotted in a rectangle of broken lines indicates the case of a standard or "ordinary" bulk FET using a uniformly doped p-type bulk silicon.

As apparent from viewing the FIG. 3 graph, the threshold voltage roll-off value δVth decreases and comes closer to zero with a decrease in thickness of the p-type layer 4, thus enabling suppression of short-channel effects. This is a similar effect to the SOIFET and is due to the fact that making the channel region thinner weakens the two-dimensional effect of a potential distribution along a drain shape, resulting in determination of the threshold voltage only by a one-dimensional potential distribution in the vertical direction.

FIG. 3 also indicates that if the δVth value is kept identical, the FD-SODELFET of this embodiment may be greater in thickness of the p-type layer 4 than SOIFETs. This in turn suggests provision of advantages which follow: a capability to make the intended MISFET without associating difficulties in formation of extra thin-films, and an ability to suppress or minimize any unwanted variation or deviation in threshold voltage otherwise occurring due to inherent deviation in film thickness of p-type layer 4. These advantages makes the embodiment structure more effectively implementable for mass-production of real devices required.

It should be noted that the effects and advantages stated above depend on the impurity concentration of the p-type layer 4. As shown in FIG. 3, if the impurity concentration of p-type layer 4 becomes greater than or equal to about 1E17/cm³, then the intended thinning-based short-channel effect suppressibility will hardly be obtainable. This teaches that successful establishment of the effects does strictly require execution of a significant amount of thinning processing. This is due to the fact that thinning must result in a decrease in extension or elongation of a depletion layer at a location immediately beneath the transistor channel region. Thus it should be required that the p-type layer 4 for use as the channel region be optimized both in impurity concentration and in thickness.

Alternatively it will also be possible to increase the impurity concentration of the p-type channel region layer 4, or select the work function of the gate electrode 6, thereby ensuring that layer 4 is partially depleted upon formation of a channel inversion layer. This enables achievement of a partially depletable SODELFET, also called partial depletion (PD)-SODELFET.

In regard to the n⁻-type layer 3 which is required to be fully depleted due to a built-in potential, this is also to be optimized in impurity concentration and thickness. This can be said because if part of n⁻-type layer 3 is failed to be depleted, then electrical shorting can occur between the source and drain, resulting in an increase in current leakage therebetween. On the other hand, in view of the fact that an exact degree of relaxation of a vertical electric field in the channel region is determinable depending solely upon the thickness of this n⁻-type layer 3, the film thickness of n⁻-type layer 3 may be set relatively greater in order to retain the channel region greater in carrier mobility.

Figure 4:
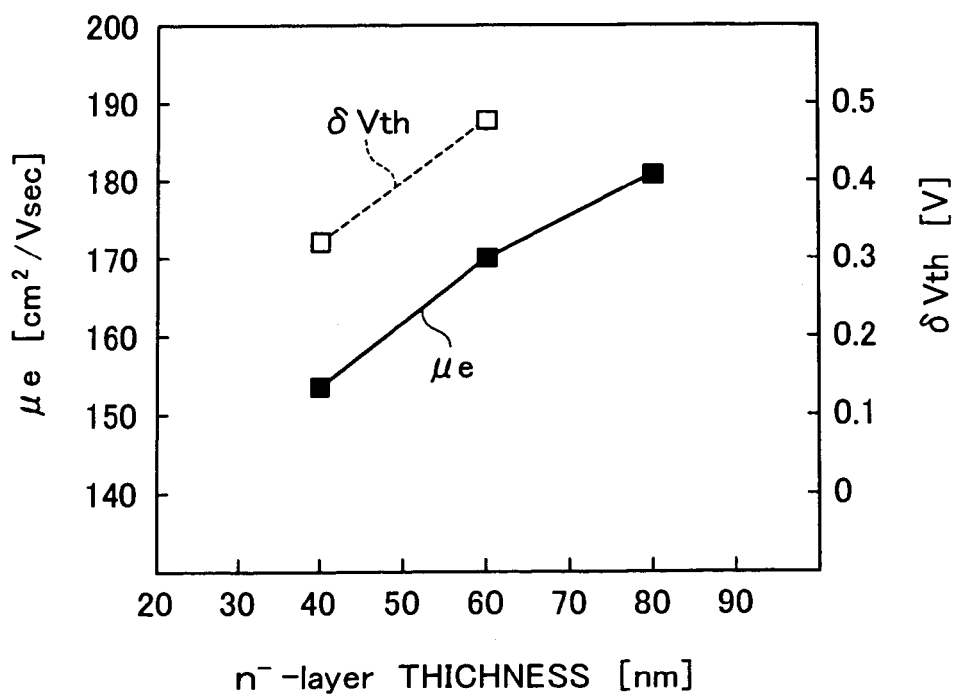
FIG. 4 is a graph showing a relation of a threshold voltage roll-off value δVth and electron mobility μe versus n$^-$-type layer thickness of the SODELFET embodying the invention in comparison with that of the SOIFET.

See FIG. 4, which is a graph showing a relation of δVth value and carrier mobility (electron mobility μe) for indication of short channel effects versus thickness of this n⁻-type layer 3. As shown herein, the thicker the n⁻-type layer 3, the greater the electron mobility μe, and thus the greater the δVth value also. To be brief, it is affirmed that there is a trade-off between the short-channel effect suppressibility and the carrier mobility improvement.

As previously stated, the junction depth of the $n^+$-type layers 7a for use as the source/drain low resistivity regions are specifically set shallower than—i.e. higher in level than—the junction between $n^-$-type layer 3 and p-type layer 2. With such unique junction depth setup, it is possible to suppress both the source/drain junction capacitance values and junction leakage more significantly than possible with ones having $n^+$-type layers 7a formed deep enough to reach the underlying p-type layer 2; in addition, it becomes expectable to obtain a higher punch-through immunity even when the threshold voltage is kept at low levels. A further advantage lies in a capability to speed up an operation of the resultant transistor owing to a decrease in source/drain junction capacitance.

It is apparent from the foregoing discussions that optimization of the impurity concentration distribution and thickness of the $p/n^-/p$ multilayer structure calls for optimization of process conditions concerned. Process simulation conducted by the inventor as named herein has revealed the fact that it is rather difficult to fabricate the $p/n^-/p$ junction three-layer lamination structure by ion implantation techniques only, as in the prior art. More specifically, whenever an attempt is made to form through ion implantation the p-type layer 2 of FIG. 1 to have an impurity concentration of approximately $1E18/cm^3$, this process must be done with a greater dose amount under application of higher acceleration energies, which would result in the impurity distribution pattern having a long tail—i.e. being expanded significantly at its skirt or "hem" portions in a direction along the depth thereof. If this is the case, the resulting impurity profile is far from the initially desired one even when forming the $n^-$-type layer 3 and p-type layer 4 of low impurity concentration values by further effectuating extra ion implantation into a surface portion of the p-type layer thus formed.

To avoid the risk, SODELFET fabrication methodology of this invention is specifically arranged to utilize epitaxial growth layers with respect to the p-type layer 4 for use as the channel region in FIG. 1 and its underlying $n^-$-type layer 3. Exemplary fabrication processes for obtaining the $p/n^-/p$ multilayer structure of FIG. 1 will be set forth below.

Figure 5A:
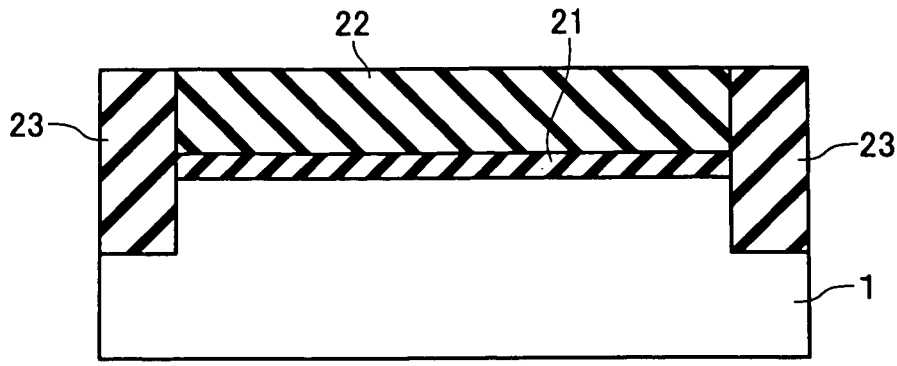
FIGS. 5A through 5D illustrate, in cross-section, some of the major process steps in the manufacture of a p/n$^-$/p multilayer structure of the FD-SODELFET of the embodiment.

Referring to FIGS. 5A to 5D, there are shown some major steps in a $p/n^-/p$ junction multilayer structure fabrication process including an element isolation process(es), in view of the applicability to practically reduced integrated circuit (IC) chips with complexities of from large-scale integration (LSI) to very large-scale integration (VLSI) and also to ultralarge-scale integration (ULSI). Firstly, as shown in FIG. 5A, a silicon substrate 1 is prepared. Then, form in a top surface of the silicon substrate 1 a multilayer mask having a buffer oxide film 21 and an overlying silicon nitride film 22. Use reactive ion etching (RIE) techniques to define trenches in element isolation regions. Embed or bury in the trenches a dielectric film 23 for use as an element isolator.

Figure 5B:
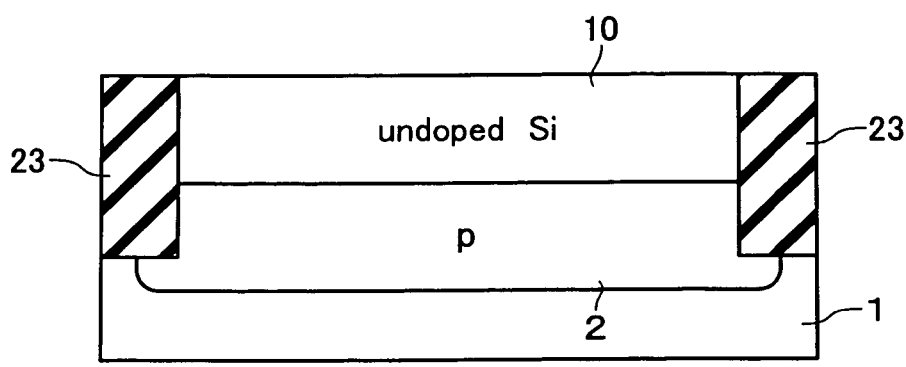

Thereafter, remove the silicon nitride film 22 and buffer oxide film 21 away from substrate 1; then, perform ion implantation of boron (B) to thereby form a p-type well layer 2 in substrate 1 as shown in FIG. 5B. Practically, boron (B) ions are implanted with a dose of $10^{13}/cm^2$ under application of an acceleration voltage of 20 KeV. And, let an undoped or "non-doped" silicon layer 10 epitaxially grow on this p-type layer 2 to a predetermined thickness of about 80 nanometers (nm), by way of example.

Figure 5C:
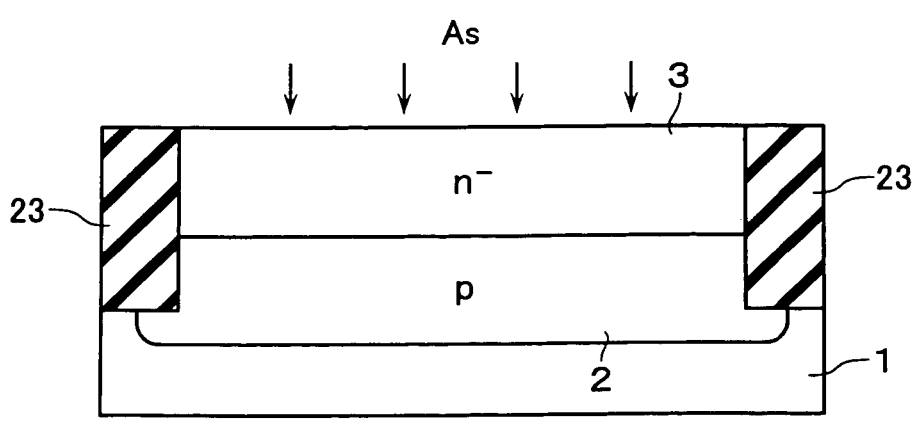
Figure 5D:
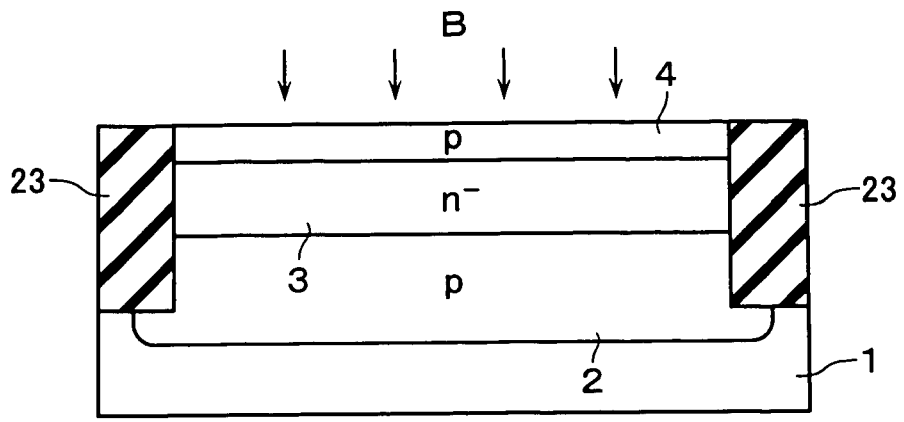

Then, as shown in FIG. 5C, perform ion implantation of arsenic (As) into this silicon layer 10, forming an n-type layer 3 on layer 2 in substrate 1. Exemplary conditions of this As ion implantation are as follows: an acceleration voltage is set at 20 KeV; dose is at $5\times10^{11}/cm^2$. Subsequently as shown in FIG. 5D, perform B ion implantation to thereby form in a surface portion of the $n^-$-type layer 3 a p-type layer 4 for later use as a transistor channel region. Preferably this B ion implantation is conducted under the conditions which follow: its acceleration voltage is at 5 KeV with a dose of $6\times10^{11}/cm^2$.

Figure 6A:
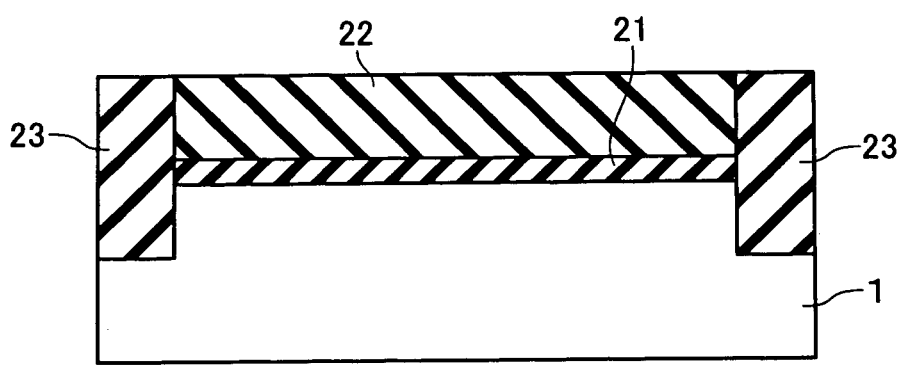
FIGS. 6A to 6E depict, in cross-section, some major process steps of another fabrication method of the p/n$^-$/p multilayer structure of the embodiment FD-SODELFET.
Figure 6B:
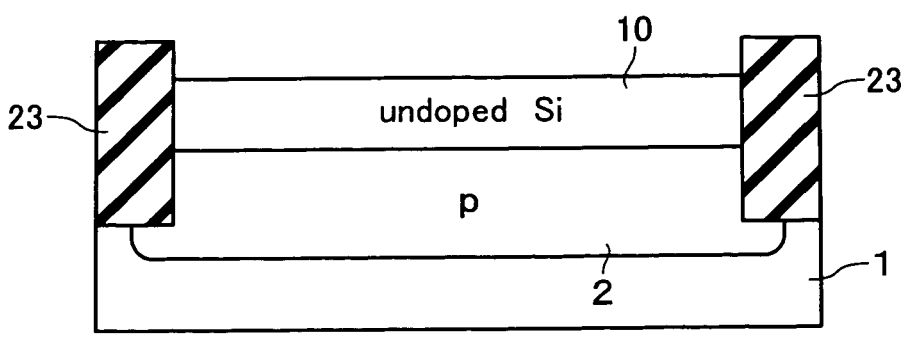
Figure 6C:
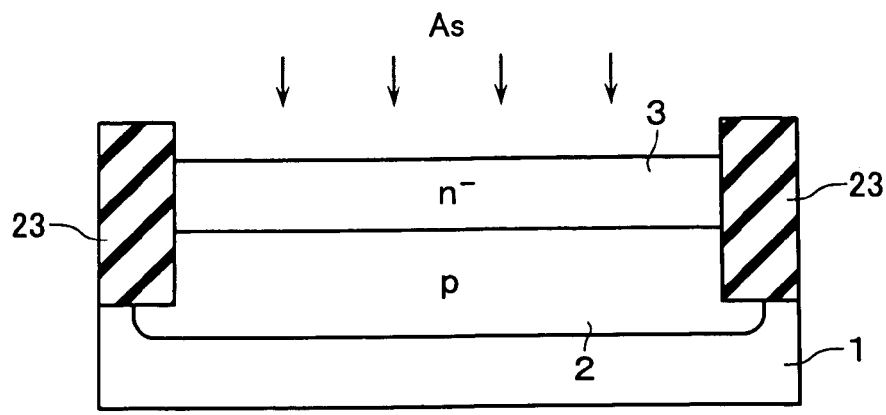
Figure 6D:
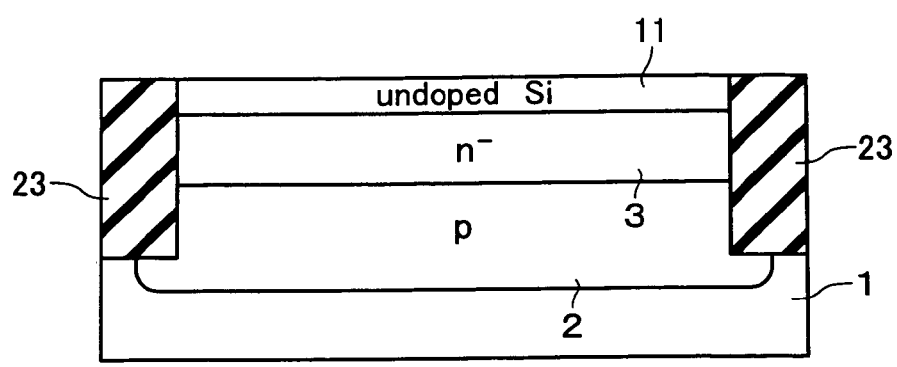

Turning to FIGS. 6A-6E, a process example is shown which utilizes a two-step epitaxial growth scheme in order to fabricate the $p/n^-/p$ junction multilayer structure. FIG. 6A shows an element isolation step similar to that shown in FIG. 5A. As shown in FIG. 6B, after completion of the element isolation, form p-type layer 2 by B ion implantation into the surface of silicon substrate 1; thereafter, let a non-doped silicon layer 10 epitaxially grow on this layer 2. Then, as shown in FIG. 6C, perform As ion implantation into this silicon layer 10, thereby forming an $n^-$-type layer 3.

Figure 6E:
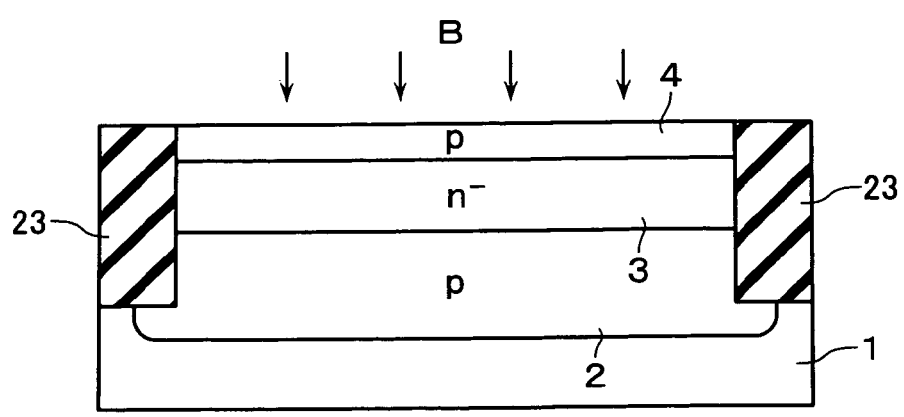

Next as shown in FIG. 6D, again perform epitaxial growth, thus forming a non-doped silicon layer 11 on $n^-$-type layer 3. Subsequently as shown in FIG. 6E, perform B ion implantation into silicon layer 11, forming a p-type layer 4 for later use as the transistor channel region.

Figure 2:
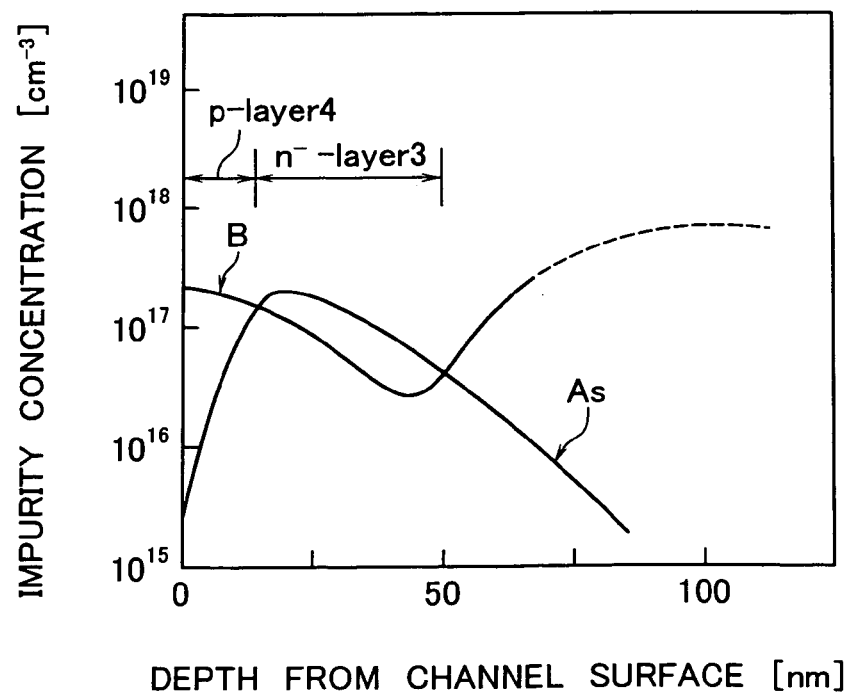
FIG. 2 is a graph showing impurity concentration distribution patterns in a direction along the depth of a channel region of the FD-SOIFET shown in FIG. 1.

An impurity profile of the $p/n^-/p$ junction multilayer structure thus fabricated in this way is shown in FIG. 2. Combined use of epitaxial growth process makes it possible to successfully form the $n^-$-type layer 3 and p-type layer 4 each having an adequately lowered impurity concentration and a carefully chosen thickness value as required to establish the complete or full depletability required.

Performing the element isolation process prior to fabrication of the $p/n^-/p$ multilayer structure in the way stated above is preferable for preclusion of any unwanted re-diffusion of an impurity once doped into the $p/n^-/p$ structure due to the presence of heat during such element isolation. This process, however, is encountered with a risk that silicon layer components in neighboring element regions are accidentally coupled or interconnected together on the surface of an element isolation region during epitaxial growth of the silicon layer. Fortunately this risk is avoidable without fail by specifically arranging the execution order of process steps in such a manner that the element isolation comes after fabrication of the $p/n^-/p$ structure.

As per the case of such element isolation process step ordering scheme, one practically implementable process for SODELFET integration will next be set forth with reference to FIGS. 7 through 12 below. Assume here that a p-type layer 2 and $n^-$-type layer 3 plus p-type layer 4 laminated on the silicon substrate 1 shown in FIG. 7 are the ones as fabricated by combined effectuation of the epitaxial growth process and ion implantation process as previously discussed in conjunction with either FIGS. 5A to 5D or FIGS. 6A-6E.

Figure 7:
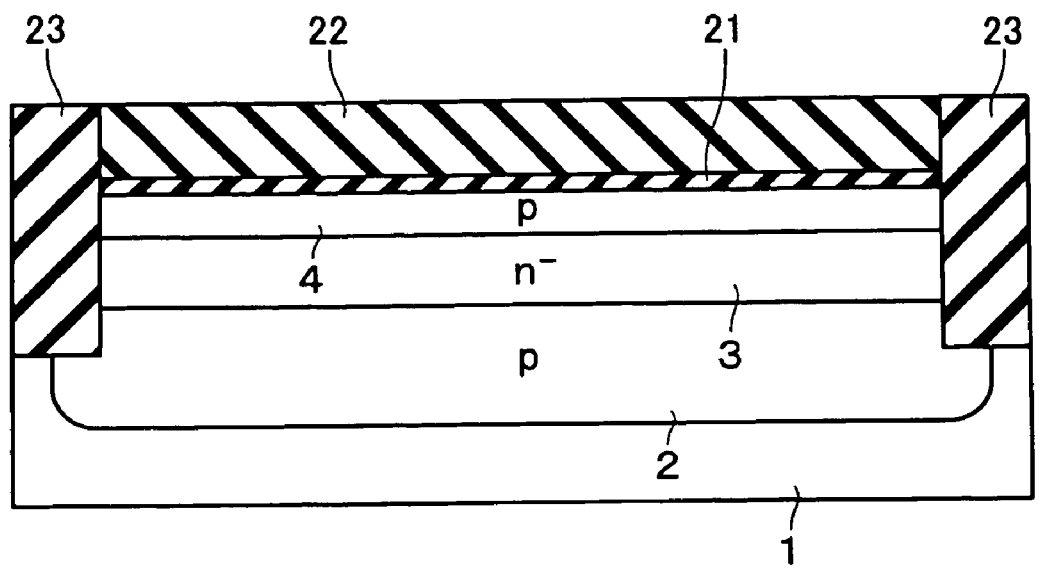
FIG. 7 shows a sectional view of a device structure at a process step of forming the p/n$^-$/p structure and a step of element isolation for integration of the embodiment FD-SODELFET.

The substrate with such $p/n^-/p$ multilayer structure formed is then subjected to pattern formation of a mask in a transistor region, the mask being made up from a lamination of a buffer oxide film 21 and silicon nitride film 22 as shown in FIG. 7. Then, RIE is done to define therein required element isolation grooves deep enough to reach the underlying p-type layer 2. Next, let an element isolation film 23 be buried in the grooves.

Figure 8:
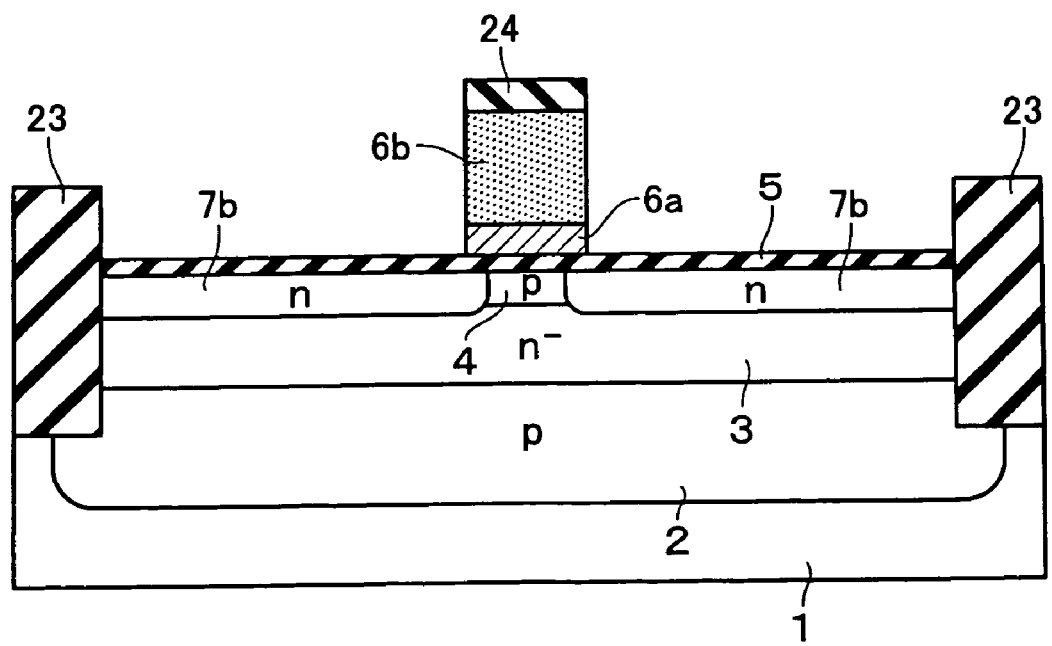
FIG. 8 is a sectional view of a device structure at a gate electrode formation step and source/drain extension region formation step in the manufacture of the FD-SODELFET.

Next, as shown in FIG. 8, form a gate dielectric film 5 and then a gate electrode 6 thereon. The gate electrode 6 may be a multilayer electrode formed of a metallic electrode 6a having its work function necessary for obtaining a prespecified threshold voltage level and a polysilicon electrode 6b. This multilayer electrode is pattern-formed with a silicon nitride film 24 being used as a mask. Then, perform As ion implantation with gate electrode 6 as a mask, thereby to form a couple of spaced-apart n-type layers for use as the source/drain extension regions 7b. Each extension region 7b is greater in junction depth than p-type layer 4; thus, the former is deeper than the latter. Note here that the junction depth of extension region 7b may alternatively be almost the same as that of p-type layer 4, when the need arises.

Figure 9:
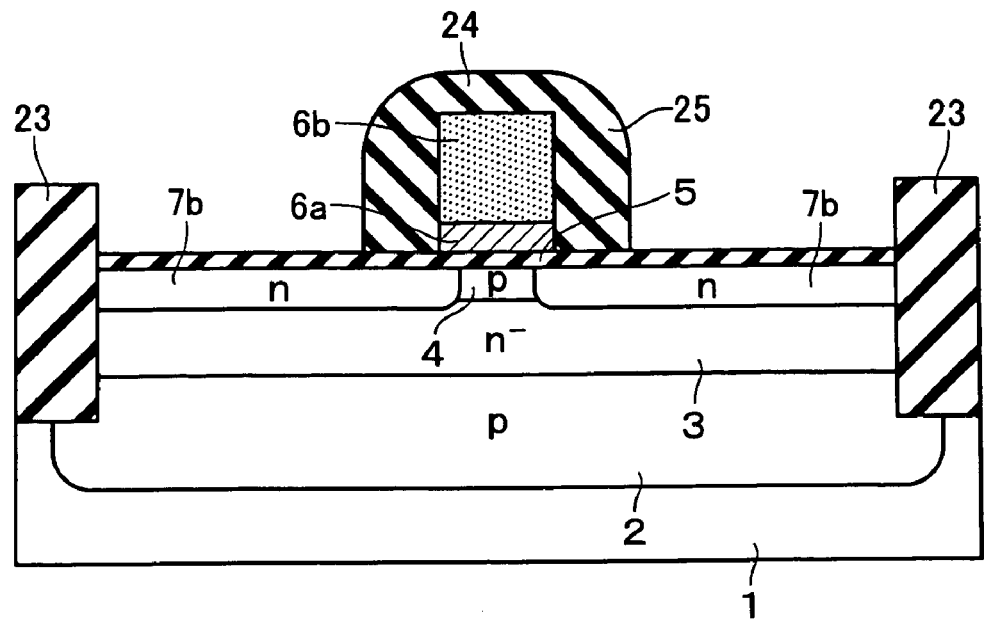
FIG. 9 is a sectional view of a device structure at a gate sidewall dielectric film formation step in the manufacture of the FD-SODELFET.
Figure 10:
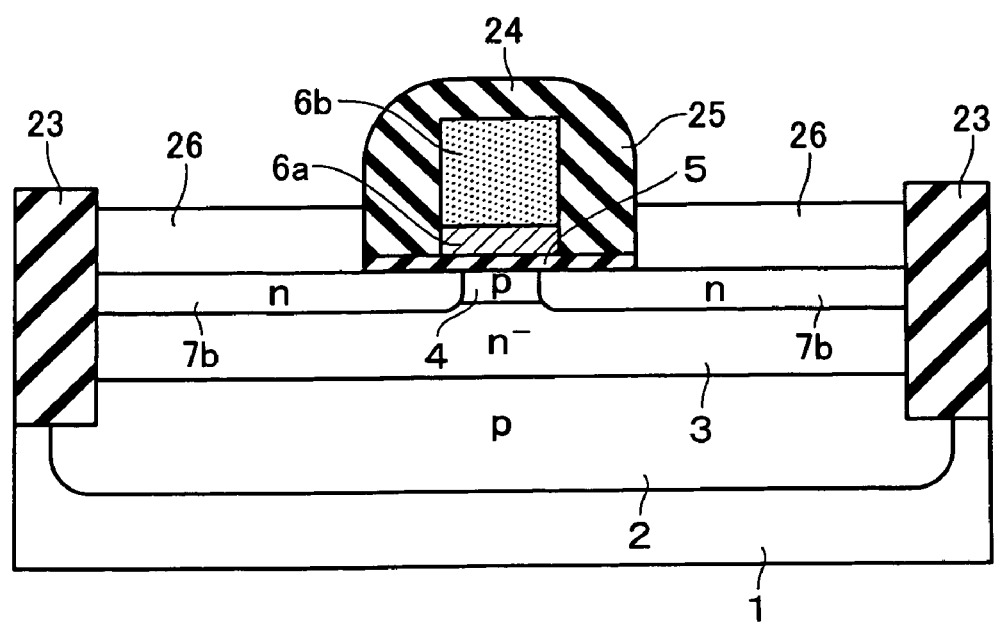
FIG. 10 is a sectional view of a device structure at a step of selective epitaxial growth of source/drain regions in the manufacture of the FD-SODELFET.

Next, as shown in FIG. 9, fabricate on a lateral wall of the gate electrode 6 a sidewall dielectric film 25 formed of a silicon nitride film. And as shown in FIG. 10, let silicon surface portions of source/drain regions be exposed; then, form on such exposed surfaces a silicon layer 26 by selective epitaxial growth methods. This is done in order to make the junction planes of p-type layer 2 and n⁻-type layer 3 stay deeper than a diffusion depth of the next-formed source/drain regions of high impurity concentration.

Figure 11:
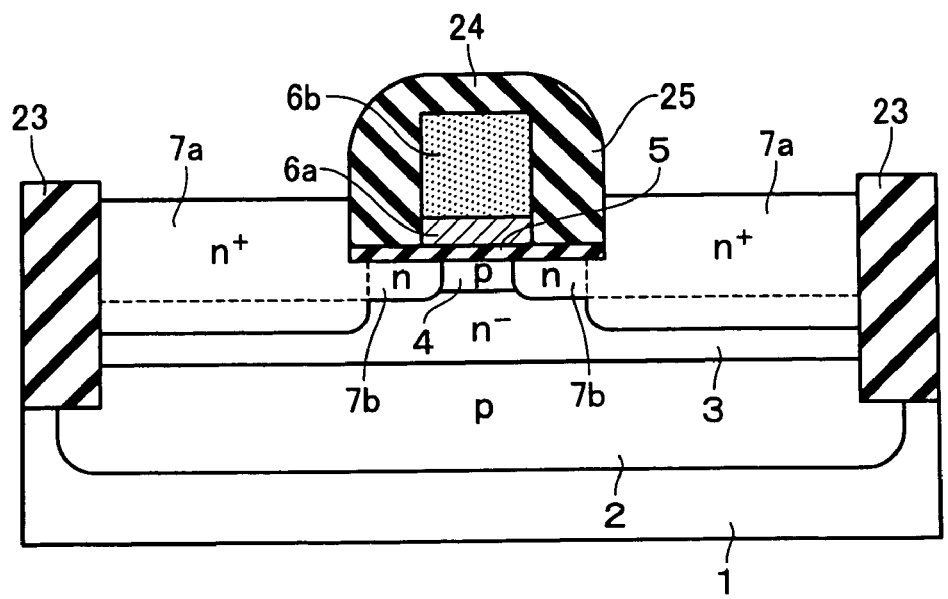
FIG. 11 is a sectional view of a device structure at a source/drain low-resistivity region formation step in the manufacture of the FD-SODELFET.
Figure 12:
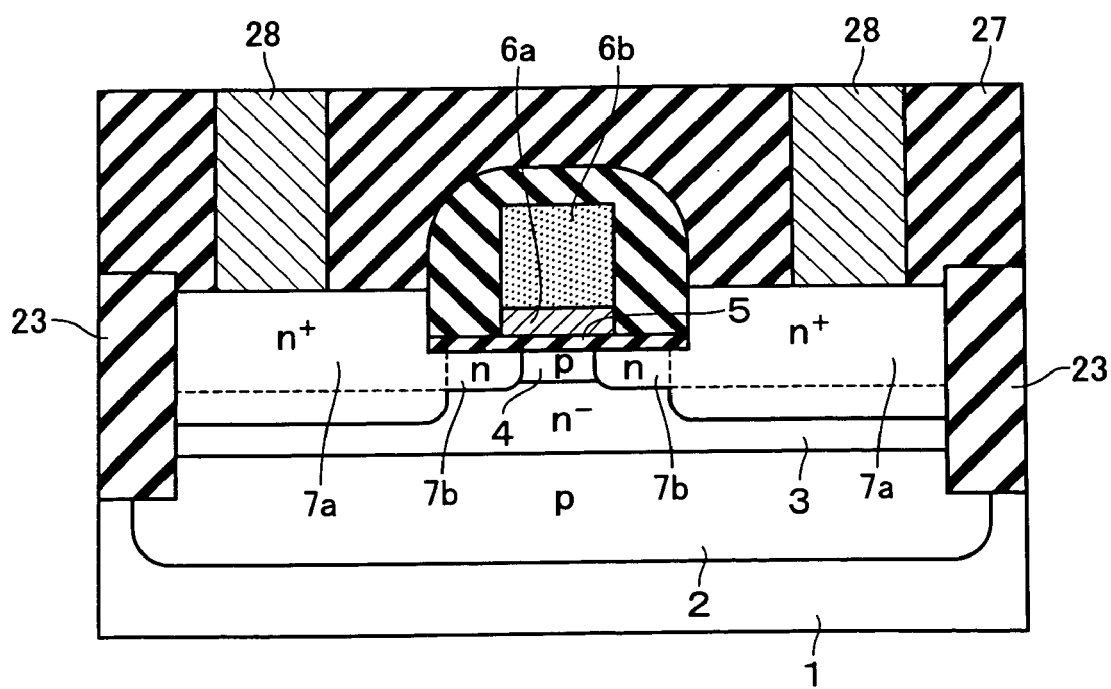
FIG. 12 is a sectional view of a device structure at a step of forming an interlayer dielectric film and contact plugs in the manufacture of the FD-SODELFET.

Thereafter, as shown in FIG. 11, perform As ion implantation to thereby form n⁺-type low-resistivity regions 7a of the source/drain. As previously stated, the diffusion depth of each low resistivity region 7a is carefully adjusted to ensure that its bottom does not reach the underlying p-type layer 2. Through execution of the process steps discussed above, the intended SODELFET is completed. Thereafter as shown in FIG. 12, an interlayer dielectric (ILD) film 27 is deposited; then, form required contact holes therein for embedment of contact plugs 28 made of tungsten (W) or other similar suitable materials. Although not specifically depicted, the process to be done thereafter includes the step of forming a pattern of metallic on-chip leads on or above the ILD film 27.

As apparent from the foregoing explanation, the SODELFET embodying the invention is specifically arranged so that the p-type layer 4 of the channel region is fabricated causing its junction depth to be less or "shallower" than that of the source/drain extension regions 7b while at the same time letting the thickness of n⁻-type layer 3 be relatively significant to thereby ensure that the bottom surface of a respective one of the source/drain low-resistivity regions 7a resides within the n⁻-type layer 3. With such an arrangement, higher carrier mobility in the channel region is guaranteed owing to vertical electric field relaxation effects; in addition, it becomes possible to greatly suppress or minimize creation of any possible short-channel effects even in sub-micron regions. Very importantly, these effects and advantages are obtainable only with the use in combination of the epitaxial growth process to obtain the p/n⁻/p junction multilayer structure. Also note that since the bottom surfaces of n⁺-type source/drain low-resistivity regions 7a stay within the n⁻-type layer 3 that is expected to be fully depleted due to a built-in potential without coming into contact with p-type layer 2, the resulting junction capacitance decreases in value, enabling achievement of high-speed operabilities while simultaneously making it possible to obtain higher punch-through immunity.

In this embodiment, in order to set the threshold voltage at the optimized level under appropriate conditions while realizing the fully depleted transistor device—that is, FD-SODELFET, required, it is also important that the gate electrode 6 is comprised of metal electrode 6a. Practically the metal electrode 6a may be made of TiN, WN or the like. Examples of the metal electrode 6a having two work functions are the ones using in combination two different conductive materials—such as TiN and WN or, alternatively, W and WN. In brief, any desired threshold voltage is attainable by use of such metal electrode 6a with appropriate work functions in a way pursuant to the threshold voltage required.

In contrast, in order to fabricate a partially depleted transistor device—that is, PD-SODELFET, the gate electrode may be formed of polysilicon film pursuant to the threshold voltage required.

It is to be noted in the above embodiment that the p-type layer 4 may be replaced with either a SiGe or Si/SiGe distortion alloy layer in order to further improve the carrier mobility of the channel region. The use of such layer makes it possible to obtain SODELFETs with much higher current drivabilities. The same goes with any one of the following embodiments as will be discussed below.

Second Embodiment

In the first embodiment above, even with optimization of the impurity concentration and thickness values of the p/n⁻/p junction multilayer structure, punch-through phenomena will possibly become hardly negligible between the source and drain in highly integrated semiconductor devices of the generation with 50-nm gate lengths or later generations.

Figure 14:
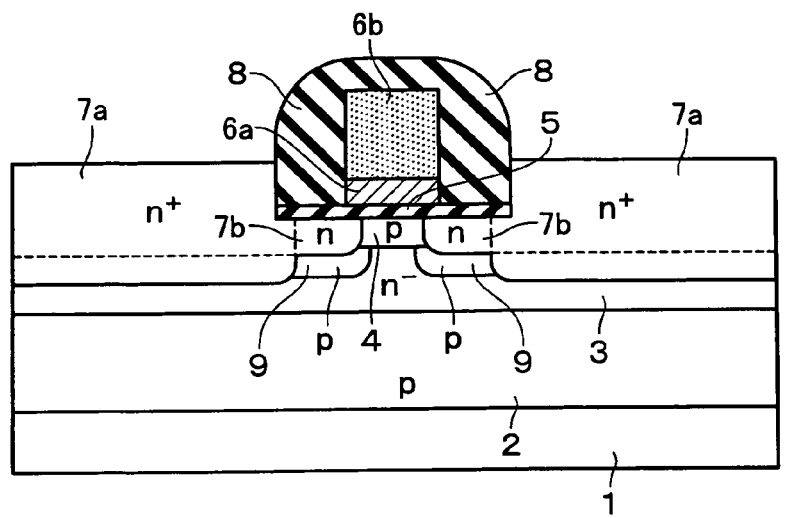
FIG. 14 is a diagram showing a sectional view of an FD-SODELFET structure in accordance with another embodiment of this invention.

See FIG. 14. This diagram depicts a sectional view of an SODELFET structure capable of preventing any punch-through with increased reliability in accordance with a second embodiment of the invention, wherein the depiction here is shown in a way corresponding to FIG. 1. This embodiment is similar to that of FIG. 1 except that p-type layers 9 are additionally provided as "halo" regions. These layers are buried in the n⁻-type layer 3 at locations immediately beneath the source/drain extension regions 7b, respectively. As in the first embodiment, appropriate value setting of the impurity concentration and thickness of p-type layer 4 enables accomplishment of the intended FD-SODELFET device. In addition, letting p-type layer 4 have a further increased impurity concentration makes it possible to obtain a PD-SODELFET.

Traditionally in order to increase the impurity concentration at a central portion of the channel region for purposes of punch-through immunity, a method has been proposed for utilizing tilt-angled or "oblique" ion implantation techniques. However in the case of this invention, increasing the impurity concentration at the center of channel region can serve as a bar to realization of higher carrier mobility by relaxation of electric fields at right angles to the surface of a substrate. Accordingly, in order to obtain the structure of FIG. 14, vertical ion implantation with gate electrode 6 as a mask is used to fabricate the p-type layer 9 right below the individual extension region 7b.

With the method of forming halo regions by oblique ion implantation, highly integrated LSIs with gate electrodes aligned at ultrafine pitches can experience partial appearance of certain circuit elements incapable of any successful ion injection due to the presence of shadows of neighboring gate electrodes, which would result in occurrence of elements with the lack of any appreciable improvement in short-channel effects. This is avoidable by formation of the p-type layers 9 as halo regions through vertical ion implantation in the way stated above. This approach enables fabrication of the FIG. 14 device structure without accompanying risks even in the case of the LSIs having highly miniaturized gate electrodes with ultrafine pitches. Thus it is possible to achieve both short channel effect suppression and guarantee of punch-through immunity at a time.

So far, the embodiments have been discussed with respect to only a single element region thereof. In the case of microfabrication of an LSI chip with multiple SODELFETs of the same device structure integrated together, a requisite number of p/n⁻/p multilayer structures may be formed in substantially the same way, i.e. through combined effectuation of epitaxial growth and ion implantation into the entire surface of a substrate. Alternatively, similar results are obtainable by use of selective ion implantation techniques—in this case, the p/n⁻/p structures are fabricated in units of channel regions of respective transistors involved.

Third Embodiment

Figure 15:
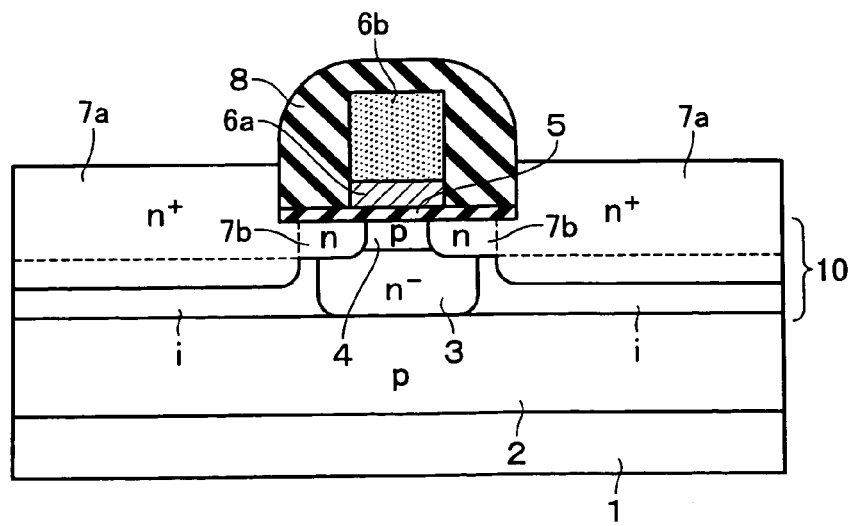
FIG. 15 is a diagram showing a sectional view of an FD-SODELFET structure in accordance with still another embodiment of the invention.

Turning to FIG. 15, there is shown in a manner corresponding to FIG. 1 a sectional view of an SODELFET also embodying the invention, which employs selective ion implantation to selectively fabricate the intended p/n⁻/p junction multilayer structure in a specified region immediately beneath a gate electrode. Unlike the embodiment of FIG. 1, arsenic (As) ion implantation is selectively done only at a channel body forming portion of an undoped or "nondoped" epitaxially grown silicon layer 10, thereby forming an n⁻-type layer 3. Thus the resulting extension regions 7b of source/drain diffusion layers 7 are such that the bottom surface of each is in contact with its underlying n⁻-type layer 3 while a respective n⁺-type low-resistivity region 7a has its bottom face residing within the nondoped silicon layer 10.

As per the p-type layer 4 for use as a transistor channel region also, this is manufacturable similarly by selective ion implantation of boron (B).

Forming the n⁻-type layer 3 exclusively at a selected portion just beneath the channel region in this way forces the bottom surfaces of source/drain low-resistivity regions 7a to stay within the nondoped, intrinsic ("i"-type) silicon layer 10. This makes it possible to further reduce the source/drain junction capacitance values.

The embodiments above have been set forth under an assumption that these mainly employ FD-SODELFETs as fully depletable transistor devices incorporated therein. Accordingly, the threshold voltage of an FD-SODELFET is determinable by the work function thereof, resulting in the flexibility of adjustment staying relatively less. However in the case of advanced LSIs, it is generally required to achieve higher performance through optimization of circuit design by mounting on a chip a mixture of several MISFETs that are different in threshold voltage from one another. To do this, the mere use of fully depleted devices would lead to occurrence of inconvenience in some cases.

One remedy for this problem is as follows. The selective ion implantation scheme as has been stated in conjunction with the third embodiment is utilized for integration of a plurality of MISFETs with different threshold voltages by making channel regions different in impurity concentration and/or thickness values. An embodiment using this scheme will next be set forth below.

Fourth Embodiment

Figure 16:
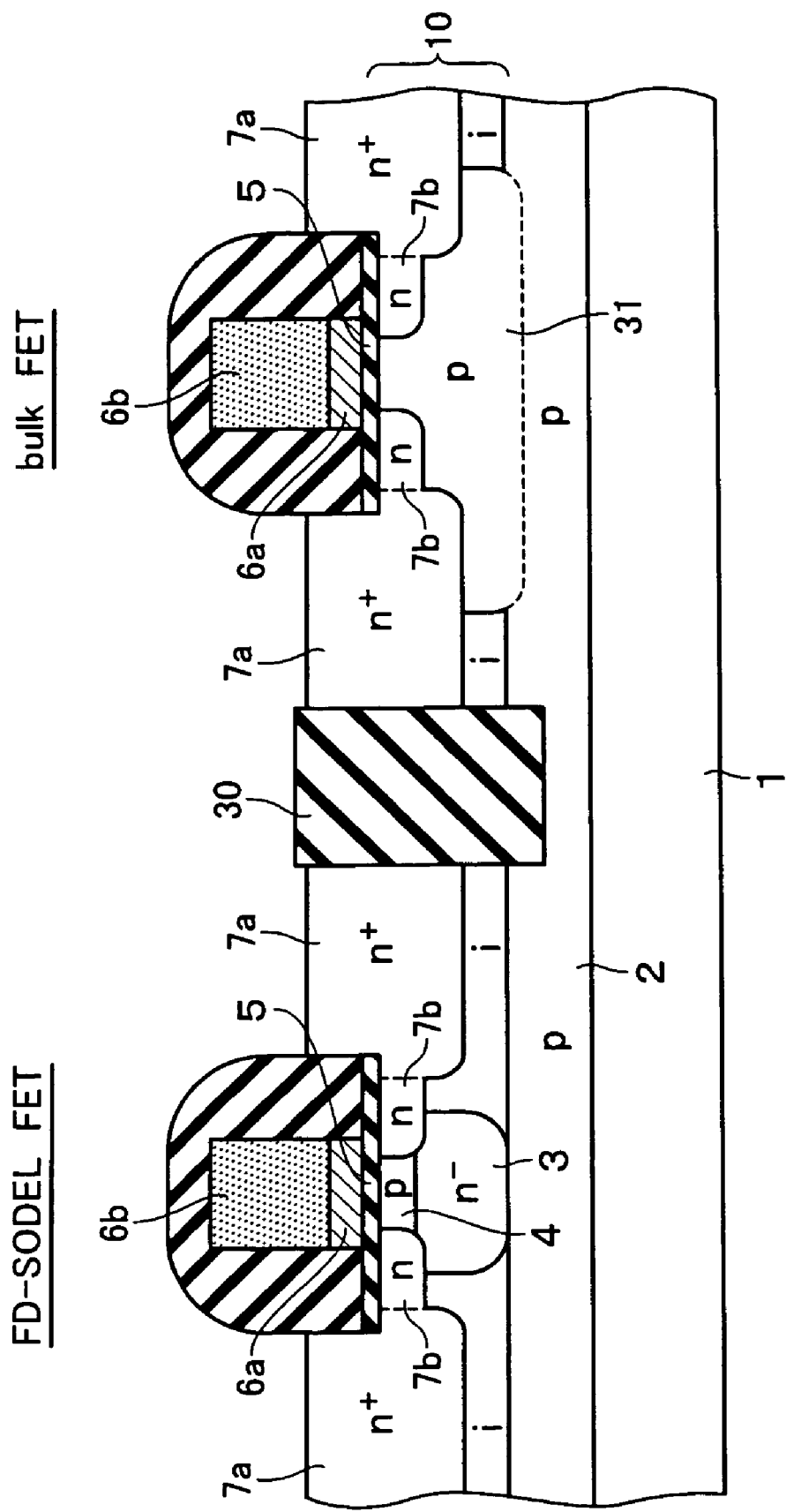
FIG. 16 depicts a sectional view of a device structure with an FD-SODELFET and a bulk FET integrated together.

A structure of main part of an LSI chip with an FD-SODELFET and a normal bulk FET integrated together is depicted in cross-section in FIG. 16, wherein the FD-SODELFET is the same in principle as that of the third embodiment stated supra. The illustrative "hybrid" LSI device structure will now be explained in accordance with a flow of its fabrication process steps. As in the fabrication process of the first embodiment, let an undoped or nondoped silicon layer 10 epitaxially grow on a silicon substrate 1 with a p-type layer formed therein. Then, embed or bury an element isolation film 30 in each element isolation region by shallow trench isolation (STI) techniques. If necessary, the p-type layer 2 may be selectively formed by ion implantation only in an SODELFET region, rather than is formed to cover an entire surface of the substrate.

Thereafter, the FD-SODELFET region is subjected, prior to formation of a gate electrode 6, to selective ion implantation similar to that discussed in conjunction with the fourth embodiment, thereby sequentially forming an n⁻-type layer 3 and p-type layer 4. In a bulk FET region, the epitaxially grown nondoped silicon layer 10 is subject to another selective ion implantation, forming a p-type bulk layer (i.e., channel body) 31 that is deep sufficient to reach the underlying p-type layer 2. Further, channel ion implantation may be done as occasion demands. Then, form the gate electrode 6 in each element formation region. Next, form source/drain's n-type extension regions 7b and n⁺-type low-resistivity regions 7a substantially simultaneously.

Whereby, it is possible to integrate on a hybrid LSI chip more than one FD-SODELFET and bulk FET which are different in threshold voltage from each other.

Fifth Embodiment

Figure 17:
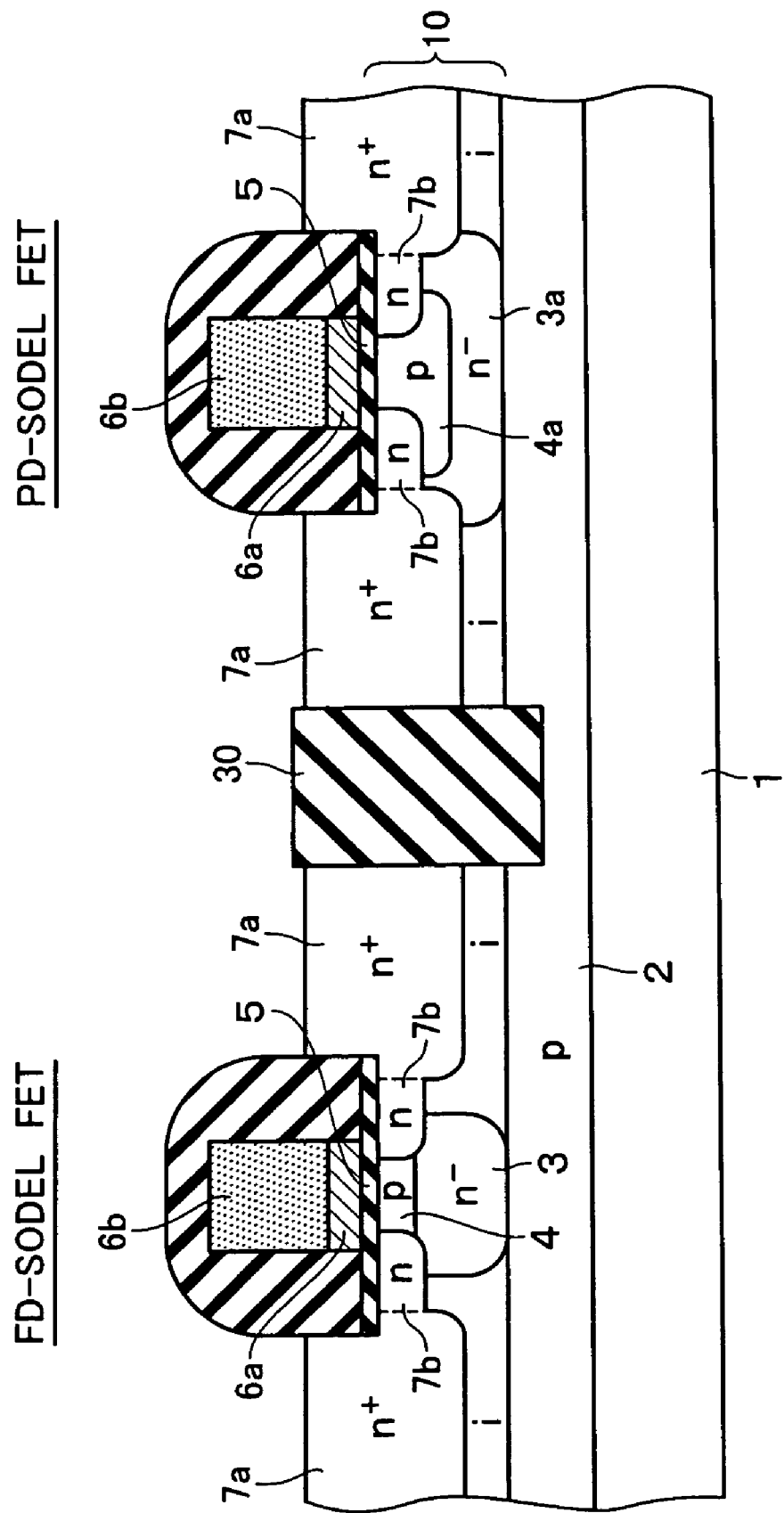
FIG. 17 shows a sectional view of a device structure with an FD-SODELFET and a PD-SODELFET integrated together.

A hybrid LSI device structure also embodying the invention with an FD-SODELFET and a PD-SODELFET integrated together is shown in FIG. 17, wherein the PD-SODELFET is a partially depletable element which lacks full depletability even upon formation of a channel inversion layer. The FD-SODELFET shown is manufacturable by similar process to that shown in FIG. 16. Regarding the PD-SODELFET, its n⁻-type layer 3a and p-type layer 4a are sequentially fabricated under specific ion implantation conditions different from the FD-SODELFET. Note here that the n⁻-type layer 3a of PD-SODELFET may be the same in process conditions as an n⁻-type layer 3 on the FD-SODELFET side. At least the PD-SODELFET's p-type layer 4a is to be formed in such a manner that it is greater both in impurity concentration and in thickness than the p-type layer 4 of FD-SODELFET. In the structure of FIG. 17, the p-type layer 4a is greater or "deeper" in diffusion depth than source/drain extension regions 7b and yet shallower than n⁺-type low-resistivity regions 7a. Also note that the p-type layer 4a and n⁻-type layer 3a are selectively formed at a location immediately beneath a channel region associated therewith. The n⁻-type layer 3a has its opposite terminate end portions as contacted with source/drain extension regions 7b respectively.

Figure 18:
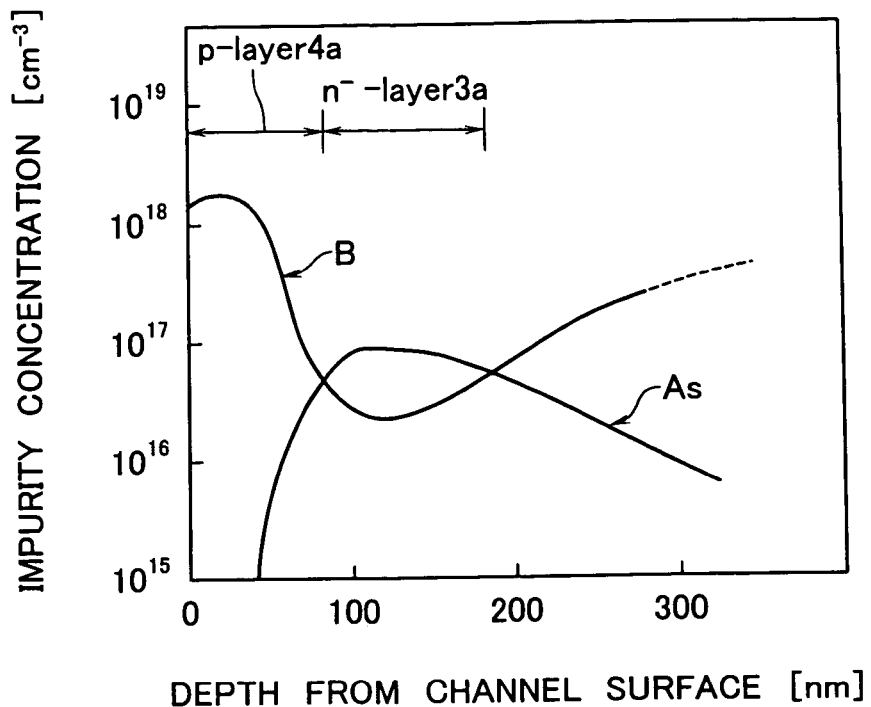
FIG. 18 is a graph showing impurity concentration distribution patterns in a channel region of the PD-SODELFET of FIG. 17.

See FIG. 18, which demonstrates an exemplary plot of impurity concentration distribution of a p/n⁻/p junction multilayer structure of the PD-SODELFET in comparison with that of FD-SODELFET shown in FIG. 2. The p-type layer 4a's boron concentration is higher than that of FIG. 2 by about one order of magnitude. With such setting, the intended PD-SODELFET is obtained which is higher in threshold voltage than the FD-SODELFET and permits p-type layer 4a to be partially depleted upon formation of a channel inversion layer. At this time, p-type layer 4a is surrounded by a depletion layer occurring between itself and extension region 7b and the fully depleted n⁻-type layer 3a, thereby becoming an electrically "floating" p-type layer.

Figure 19:
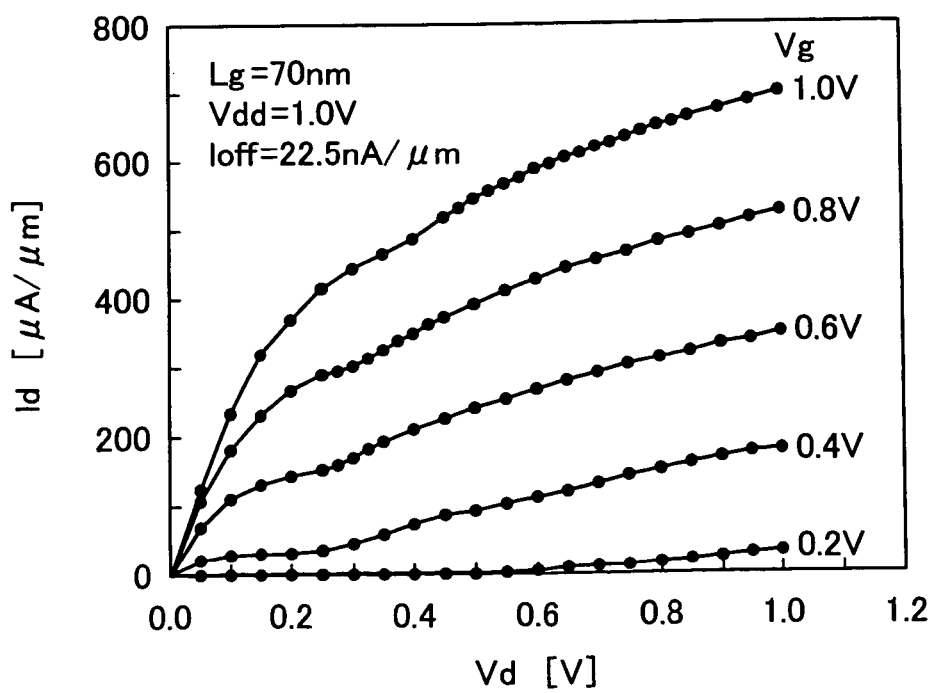
FIG. 19 is a graph showing static characteristics of the PD-SODELFET of FIG. 17.

FIG. 19 is a graph showing drain voltage Vd versus drain current Id characteristics of the above-noted PD-SODELFET with gate voltage Vg as a parameter, which have been obtained through computation. Here, the gate length Lg is set at 70 nm, supply voltage is Vdd=1V, and turn-off current is Ioff=22.5 nA/μm. As apparent from this graph, the drain current Id behaves to rapidly increase in intensity at a certain value of drain voltage Vd. This is known as "kink" characteristics among those skilled in the semiconductor device art.

This kink instability is the property unique to PD-SODELFETS, which is obtainable by virtual threshold voltage drop-down occurring due to partial depletion of the p-type layer 4a. Practically this kink property takes place upon virtual reduction of the threshold voltage, which in turn is caused by a mechanism which follows: upon exceeding of a certain drain voltage, holes as created by impact ionization are stored or accumulated at the p-type layer.

Figure 20:
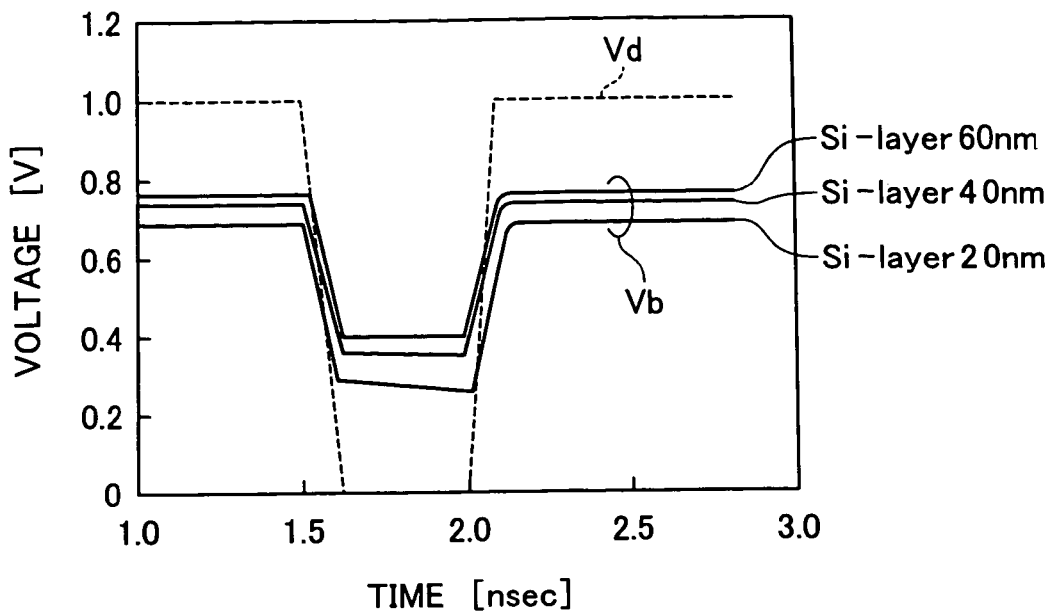
FIG. 20 is a graph showing the drain voltage dependency of a body potential of the PD-SODELFET of FIG. 18.

Also see FIG. 20. This is a graph showing experimental data of the PD-SODELFET for demonstrating a typical plot of voltage Vb of the channel body (i.e. p-type layer 4a) as a function of time with epitaxially grown silicon layer 10's thickness as a parameter when causing a drain voltage Vd to rapidly vary in potential with time in a pulse-like fashion as indicated by dotted lines, while letting a gate voltage Vg kept constant. As the drain voltage Vd changes, the body potential Vb changes accordingly, which in turn well demonstrates that p-type layer 4a is substantially in the floating state.

Sixth Embodiment

Figure 21:
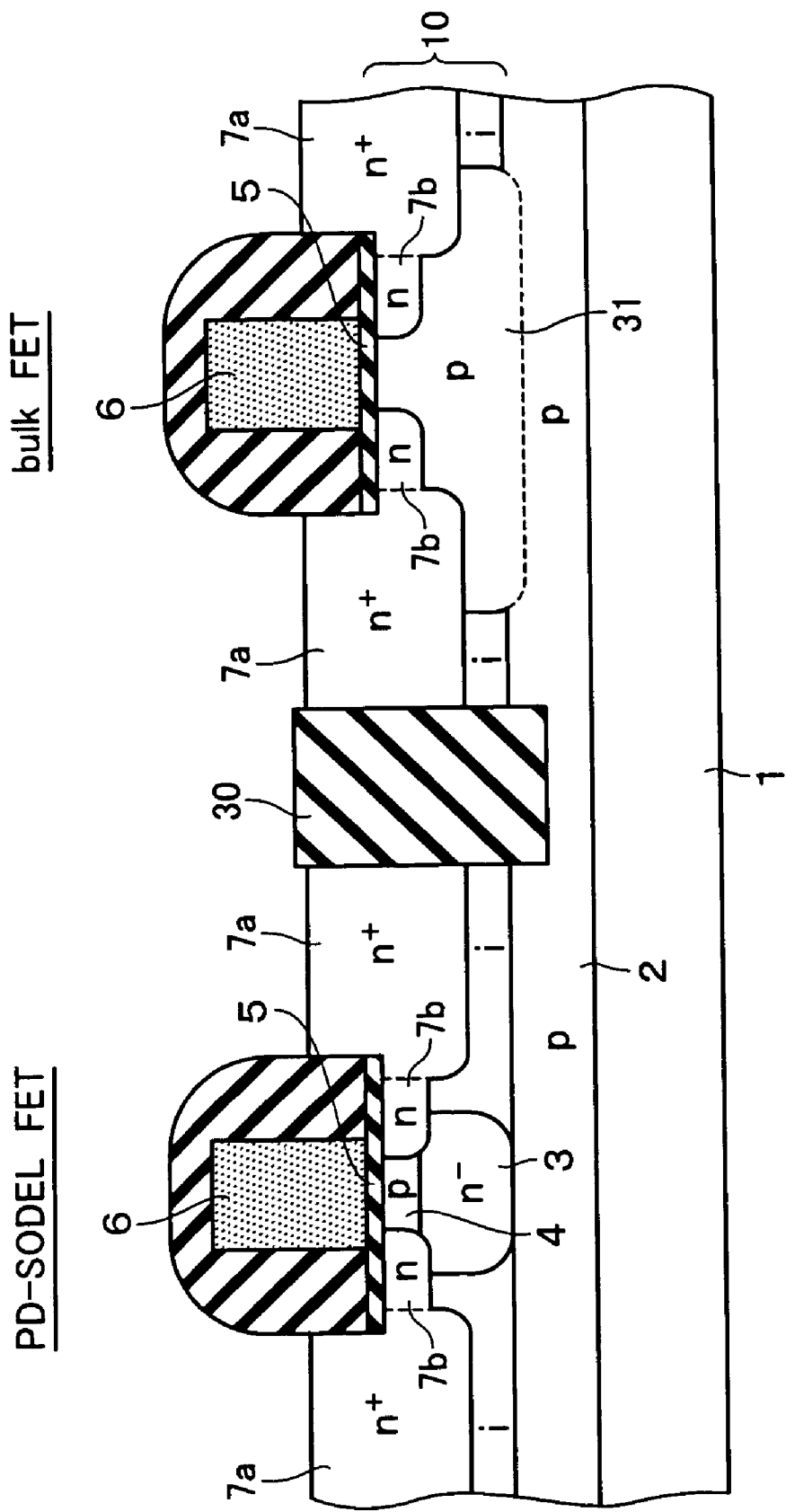
FIG. 21 depicts a sectional view of a device structure with a PD-SODELFET and a bulk FET integrated together.

FIG. 21 shows an integrated structure having an PD-SODELFET and a normal bulk FET in accordance with sixth embodiment. The respective channel body structures of the PD-SODELFET and the bulk FET are similar to that of the embodiment of FIG. 16. The p-type layer 4 of the PD-SEDELFET is, however, formed to have a higher impurity concentration than that of the FD-SODELFET in FIG. 16. Whereby, the p-type layer 4 becomes to be partially depleted when a channel inversion layer is formed. In General, when a metal gate electrode is used in a bulk FET, gate threshold voltage thereof becomes too high. In contrast, according to this embodiment, the threshold voltage of the bulk FET may be set to lower. AS a result, it is possible to obtain a high current drivable bulk FET.

It must be noted that the FD-SODELFETs and PD-SODELFETs in FIGS. 16, 17 and 21 are modifiable so that each is structured so that p-type layers 9 are buried as halo regions at locations right below the source/drain extension regions 7b respectively, as in the embodiment of FIG. 14.

An explanation will next be given of one exemplary circuitry preferable for use in cases where either one of the FD-SODELFET and PD-SODELFET embodying this invention is combined with more than one bulk FET for integration on a chip substrate.

Seventh Embodiment

Figure 22:
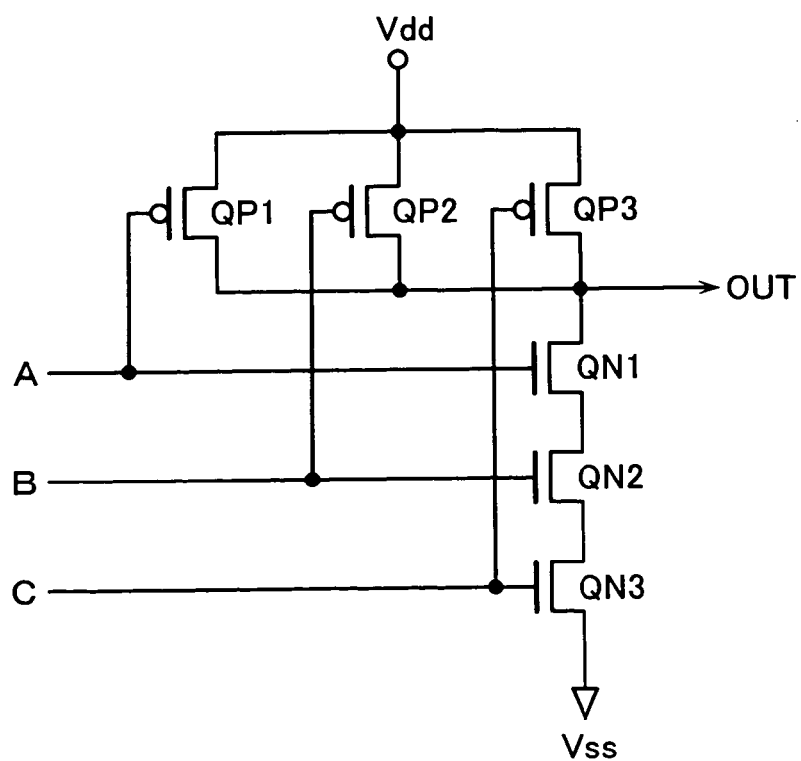
FIG. 22 is a diagram showing a configuration of one preferable circuit example adaptable for application of this invention.

FIG. 22 depicts a configuration of NAND gate circuitry, which is arranged using a serial connection of three n-channel transistors QN1 to QN3 and a parallel combination of p-channel transistors QP1-QP3. The n-channel transistors QN1 to QN3 serially connected between an output terminal OUT and ground terminal Vss with the gates serving as input terminals A, B and C, respectively. The p-channel transistors QP1 to QP3 are connected in parallel between the output terminal OUTPUT and a power supply terminal Vdd with the gates being connected to the respective input terminals A to C. With the illustrative circuitry, in case standard or ordinary MIS-FETs are employed therein, potentially different substrate bias voltages are applied to the longitudinally stacked transistors QN1-3, resulting in these transistors becoming virtually different in threshold voltage from one another.

To avoid this, the transistors QN1-QN3 are formed of FD-SODELFETs, PD-SODELFETs shown in FIG. 1, or PD-SODELFETs shown in FIG. 17 which are inherently less in substrate bias influence than bulk FETs. On the contrary the p-channel transistors QP1-QP3 are designed to employ bulk FETs that have the same structure shown in FIG. 16 and are less in current leakage otherwise occurring due to the presence of possible parasitic bipolar transistor components. With such an arrangement, it is possible to attain higher operation stability and also higher noise margins.

Eighth Embodiment

Figure 23:
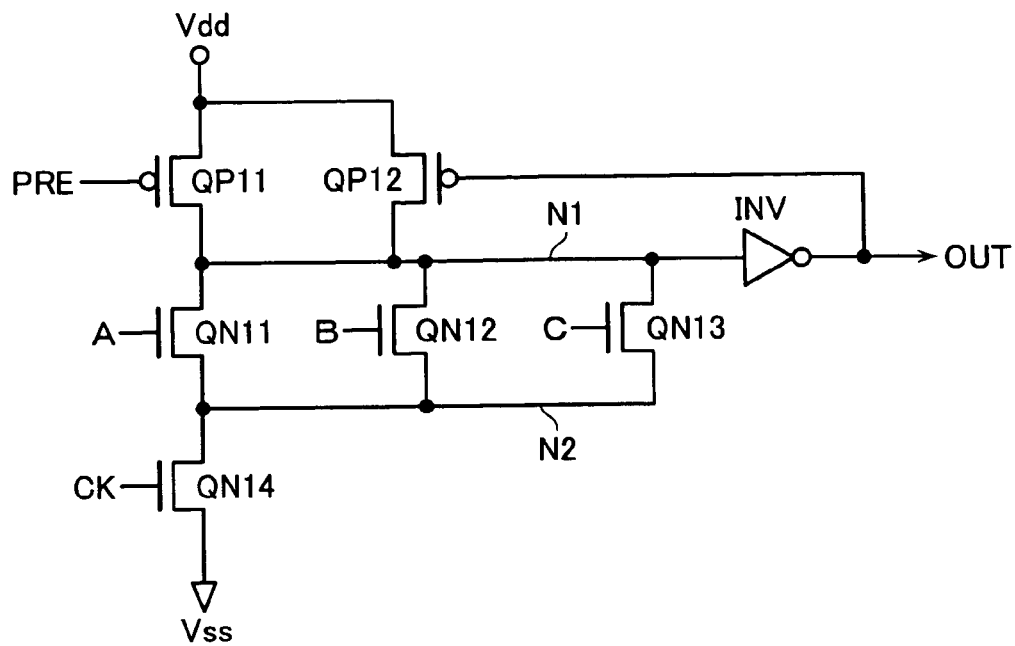
FIG. 23 is a diagram showing another preferred circuit example adaptable for application of this invention.

Turning to FIG. 23, there is shown a dynamic "domino" circuit. n-channel transistors QN11-QN13, that are connected between nodes N1 and N2 in parallel, are switching devices with the gates serving as input terminals A, B, and C, respectively. Provided between the node N1 and a power supply terminal Vdd is a precharging p-channel transistor QP11, of which gate is driven by precharge signal PRE. n-channel activation transistor QN14 is disposed between the node N2 and a ground terminal Vss, of which gate is driven by clock signal CK. The node N1 is coupled to an output terminal OUT through an inverter INV. Further provided between node N1 and supply terminal Vdd is a p-channel transistor QP12 as controlled by a voltage appearing at output terminal OUT.

With such clock-driven dynamic circuit, it becomes difficult to achieve high speed operations if the node N1 is significant in capacitance. In addition, if the transistor QN11-QN13 are great in source/drain junction capacitance then storage charge of node N1 can be distributed when the precharging transistor QP11 and "clocking" transistor QN14 is off-state with inputs A, B and C of transistors QN11-13 being set at "High" or "H" level, causing node N1—this is expected to retain or hold "H" level=Vdd—to significantly decrease in potential to a level below Vdd. Adversely if the capacitance is less then the resultant noise margin tends to decreases. Thus, it is required to optimize the capacitance of node N1 in view of the relationship with drivability of transistors QN11-13. An exemplary approach to meeting this need is to employ either FD-SODELFETs or PD-SODELFETS shown in FIG. 1 for transistors QN11-13 since these FD/PD-SODELFETs are capable of retaining the node N1's capacitance at relatively low levels while using bulk FETs shown in FIG. 16 for transistors QN14 and QP11-12.

With such an arrangement, it is possible to attain the intended circuitry with high-speed operability without reducing noise margins thereof. In other words, in case bulk FETs are exclusively used to make up the dynamic circuit of FIG. 23, the node N1 increases in capacitance, leading to difficulty in charge-up/discharging of it at high speeds. In contrast, letting transistors QN11-13 be formed of FD/PD-SODELFETs capable of holding the capacitance of node N1 at relatively low levels makes it possible to attain high-speed operations. This also makes it possible to reliably hold the voltage potential that node N1 is expected to hold.

Alternatively, simply arranging the entirety of dynamic circuit of FIG. 23 by use of SODELFETs would result in a decrease in noise withstanding ability because of the fact that the body region must stay in the floating state causing parasitic bipolar transistor effects to take place while at the same time the node N1 is lowered in its storable charge amount. In light of this, the transistors QN11-QN13 are formed of SODELFETs whereas the remaining portions are of bulk FETs. This makes it possible to well optimize both the noise margin and the high-speed operability, which are in a trade-off relationship.

It is also noted that analog circuits and/or sense amplifier circuits for use with semiconductor memory devices are typically formed of differential amplifiers. For instance, a differential amplifier made up from two complementary metal oxide semiconductor (CMOS) circuits is under a strict requirement that such two CMOS circuits are exactly identical in threshold voltage to each other. However, in the case of SODELFETs embodying the invention, these can experience deviation or "offset" in threshold voltage values under influence of the history in the past in view of the fact that a channel body region(s) is/are in the floating state. This makes it rather difficult to align the threshold voltage levels of two CMOS circuits in any events. Consequently, even in the LSI chip using SODELFETs embodying the invention, it will be preferable to employ "different-FET-for-different-part" schemes for using bulk FETs for the differential amplifiers.

Figure 24:
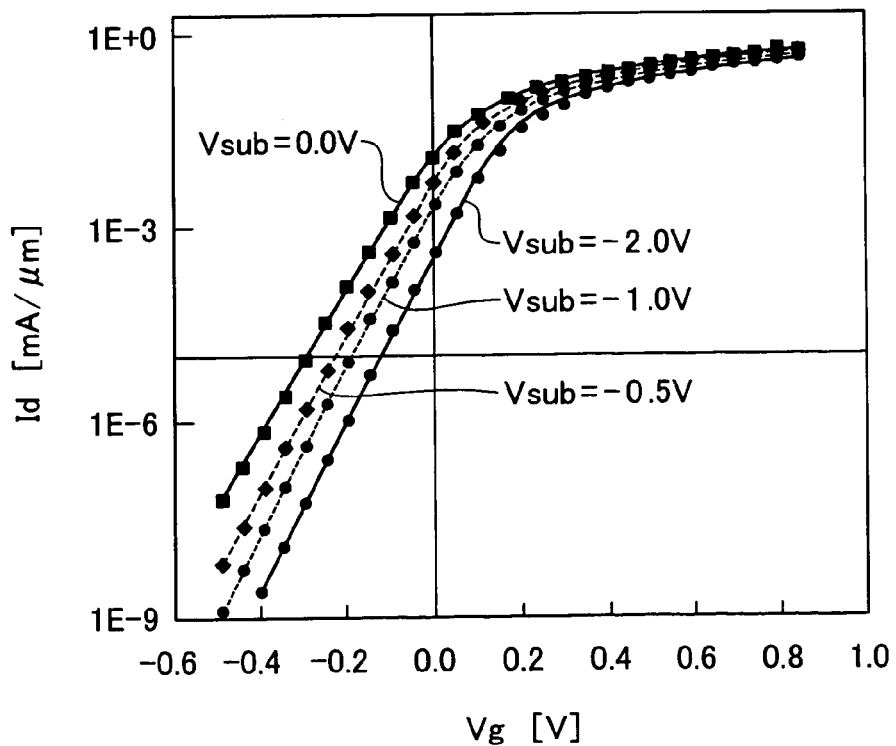
FIG. 24 is a graph demonstrating the effect of substrate bias application of the FD-SODELFET in accordance with this invention.

In LSIs using the FD-SODELFETs embodying the invention, it is also effective to additionally comprise substrate bias application circuitry for selectively applying a substrate bias voltage for threshold voltage adjustment to the p-type layer at lower part in case p/n⁻/p junction multilayer structures are provided separately in units of on-chip elements. Especially for the FD-SODELFET with the p-type layers 9 formed as halo regions beneath the source/drain extension regions 7b as shown in FIG. 14, it has been affirmed that bias application to p-type layer 2 enables establishment of enhanced threshold voltage adjustability. In this respect, see FIG. 24 which shows a plot of drain current Id of the FIG. 14 FD-SODELFET as a function of gate voltage Vg for different substrate bias voltages Vsub being applied to p-type layer 2. It would be apparent from viewing this Id-Vg characteristic diagram that an LSI chip with FD-SODELFETs of different threshold voltage levels integrated together is obtainable by letting the p-type layer 2 be subdivided into portions in units of on-chip elements and also by connecting substrate bias application circuitry thereto.

It has been stated that in accordance with this invention, it is possible to provide a semiconductor device having one or more transistors, which device is capable of attaining by use of bulk semiconductor both miniaturization and performance enhancement while at the same time simplifying the structure thereof.

Ninth Embodiment

Each of the NAND gate circuit shown in FIG. 22 and the dynamic domino circuit shown in FIG. 23 may be configured to employ a combination of SOIFETs and bulk FETs which are formed in a partial SOI substrate. FIG. 25 shows an integrated structure of an SOIFET and a bulk FET integrally formed in a partial SOI substrate. The partial SOI substrate has an SOI structure region where a thin silicon layer 103 is formed over a silicon substrate 101 with an insulating film 102 buried therebetween, and a bulk region where no insulating film is buried.

By use of such the partial SOI substrate, the SOIFET is formed in the silicon layer 103 of the SOI region. The SOIFET has a gate electrode 202 formed above the silicon layer 103 with a gate insulating film 201 interposed therebetween, and source/drain diffused layers 203. The source/drain diffused layers 203 are formed as to be contacted with the insulating film 102. In such a case that the silicon layer is sufficiently thin, the SOIFET becomes a fully depleted FET. In the bulk region, an n-type (or p-type) well layer 301 is formed. The bulk FET is formed in the bulk region to have a gate electrode 303 formed above the well layer 301 with a gate insulating film 302 interposed therebetween, and source/drain diffused layers 304.

n-channel transistors QN1-QN3 in the NAND gate circuit shown in FIG. 22 are formed of SOIFETs as shown in FIG. 25. On the contrary, p-channel transistors QP1-QP3 in the NAND gate circuit are formed of bulk FET shown in FIG. 25. As a result, based on the same reason as explained in the seventh embodiment, it is possible to attain higher operation stability and also higher noise margins.

n-channel transistors QN11-QN13 in the dynamic domino circuit shown in FIG. 23 are formed of SOIFETs shown in FIG. 25. On the contrary, p-channel transistors QP1, QP12 and n-channel transistor QN14 in the dynamic domino circuit are formed of bulk FET shown in FIG. 25. With such an arrangement, it is possible to attain the intended circuit with high-speed operability without reducing noise margins, as similar to the eighth embodiment.

Having described the embodiments consistent with the present invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A semiconductor device comprising:
   a semiconductor substrate having a surface;
   a gate electrode as formed over the surface of said semiconductor substrate with a gate dielectric film sandwiched there between;
   a pair of source and drain diffusion layers formed in said semiconductor substrate to oppose each other with a channel region laterally interposed there between at a location immediately beneath said gate electrode;
   a first impurity doped layer of a first conductivity type formed in said channel region between the source/drain diffusion layers;
   a second impurity doped layer of a second conductivity type formed under said first impurity doped layer and the source and drain diffusion layers; and
   a third impurity doped layer of the first conductivity type formed under said second impurity doped layer, wherein
   said first impurity doped layer is equal to or less in junction depth than said source/drain diffusion layers, and wherein
   said second impurity doped layer is determined in impurity concentration and thickness causing a depth of its junction with said third impurity doped layer to be greater than a junction depth of said source/drain diffusion layers while permitting said second impurity doped layer to be fully depleted due to a built-in potential creatable between said first and third impurity doped layers, and wherein
   said source/drain diffusion layers each comprise a low resistivity region and an extension region being formed to extend from this low resistivity region toward said channel region and being lower in impurity concentration and shallower in depth than said low resistivity region, said low resistivity region having a bottom surface residing within said second impurity doped layer.

2. The device according to claim 1, wherein said first impurity doped layer is determined in impurity concentration and thickness to be fully depleted upon formation of a channel inversion layer.

3. The device according to claim 2, wherein said gate electrode is formed of a metal film.

4. The device according to claim 1, wherein said first impurity doped layer is determined in impurity concentration and thickness to be partially depleted upon formation of a channel inversion layer.

5. The device according to claim 4, wherein said gate electrode is formed of a poly-silicon film.

6. The device according to claim 1, wherein each of said first and second impurity doped layers is formed through ion implantation of an impurity into an undoped semiconductor layer as has been epitaxially grown on said semiconductor substrate with said third impurity doped layer formed therein.

7. The device according to claim 1, further comprising:
fourth impurity doped layers of the first conductivity type as embedded to be in contact with the extension regions of said source/drain diffusion layers.

8. The device according to claim 1, wherein the low resistivity regions of said source/drain diffusion layers are formed to have top surfaces higher in level than said gate dielectric film.

9. The device according to claim 1, wherein said gate electrode has a metal film as contacted with the gate dielectric film.

* * * * *